(12) United States Patent
Oh et al.

(10) Patent No.: US 12,265,291 B2
(45) Date of Patent: Apr. 1, 2025

(54) DISPLAY DEVICE

(71) Applicant: LG ELECTRONICS INC., Seoul (KR)

(72) Inventors: Jaebok Oh, Seoul (KR); Hunsick Woo, Seoul (KR); Seongmo Yang, Seoul (KR); Sanghun Baek, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/699,061

(22) PCT Filed: Aug. 23, 2022

(86) PCT No.: PCT/KR2022/012567
§ 371 (c)(1),
(2) Date: Apr. 5, 2024

(87) PCT Pub. No.: WO2023/224172
PCT Pub. Date: Nov. 23, 2023

(65) Prior Publication Data
US 2024/0411168 A1    Dec. 12, 2024

(30) Foreign Application Priority Data

May 20, 2022    (KR) ........................ 10-2022-0062086

(51) Int. Cl.
*G02F 1/1333* (2006.01)
*G02F 1/1345* (2006.01)
*H05K 1/18* (2006.01)

(52) U.S. Cl.
CPC .. *G02F 1/133314* (2021.01); *G02F 1/133322* (2021.01); *G02F 1/13452* (2013.01);
(Continued)

(58) Field of Classification Search
CPC ......... G02F 1/133314; G02F 1/133322; G02F 1/13452; G02F 2201/465; H05K 1/181; H05K 2201/10136
(Continued)

(56) References Cited

U.S. PATENT DOCUMENTS

2011/0126440 A1* 6/2011 Lee ........................ H05K 5/02
                                                                40/700
2015/0226997 A1    8/2015 Tomomasa
(Continued)

FOREIGN PATENT DOCUMENTS

KR    10-1419245 B1    7/2014
KR    10-1463575 B1    12/2014
(Continued)

*Primary Examiner* — Christopher M Raabe
(74) *Attorney, Agent, or Firm* — Birch, Stewart, Kolasch & Birch, LLP

(57) ABSTRACT

A display device is disclosed. The display device of the present disclosure may include: a display panel; a frame which is disposed at a rear of the display panel, and to which the display panel is coupled; a board mounted on one surface of the frame; a source PCB disposed on the one surface of the frame and electrically connected to the display panel and the board; a rib protruding from the frame and by which one side of the source PCB is caught; and a holder opposite to the rib with respect to the source PCB and by which the other side of the source PCB is caught, wherein the holder is detachably coupled to the frame.

15 Claims, 20 Drawing Sheets

(52) U.S. Cl.
CPC ....... *H05K 1/181* (2013.01); *G02F 2201/465* (2013.01); *H05K 2201/10136* (2013.01)

(58) Field of Classification Search
USPC .......................................................... 349/56
See application file for complete search history.

(56) References Cited

U.S. PATENT DOCUMENTS

| | | | |
|---|---|---|---|
| 2020/0178425 A1* | 6/2020 | Bang | H05K 7/20963 |
| 2023/0074702 A1* | 3/2023 | Itakura | G02F 1/13471 |

FOREIGN PATENT DOCUMENTS

| | | | | |
|---|---|---|---|---|
| KR | 10-1565935 B1 | 11/2015 | | |
| KR | 10-2017-0014952 A | 2/2017 | | |
| KR | 10-2018-0053855 A | 5/2018 | | |
| KR | 10-2236800 B1 | 4/2021 | | |
| KR | 2024068409 A | * | 5/2024 | ............. H05K 1/147 |

\* cited by examiner

[FIG. 1]
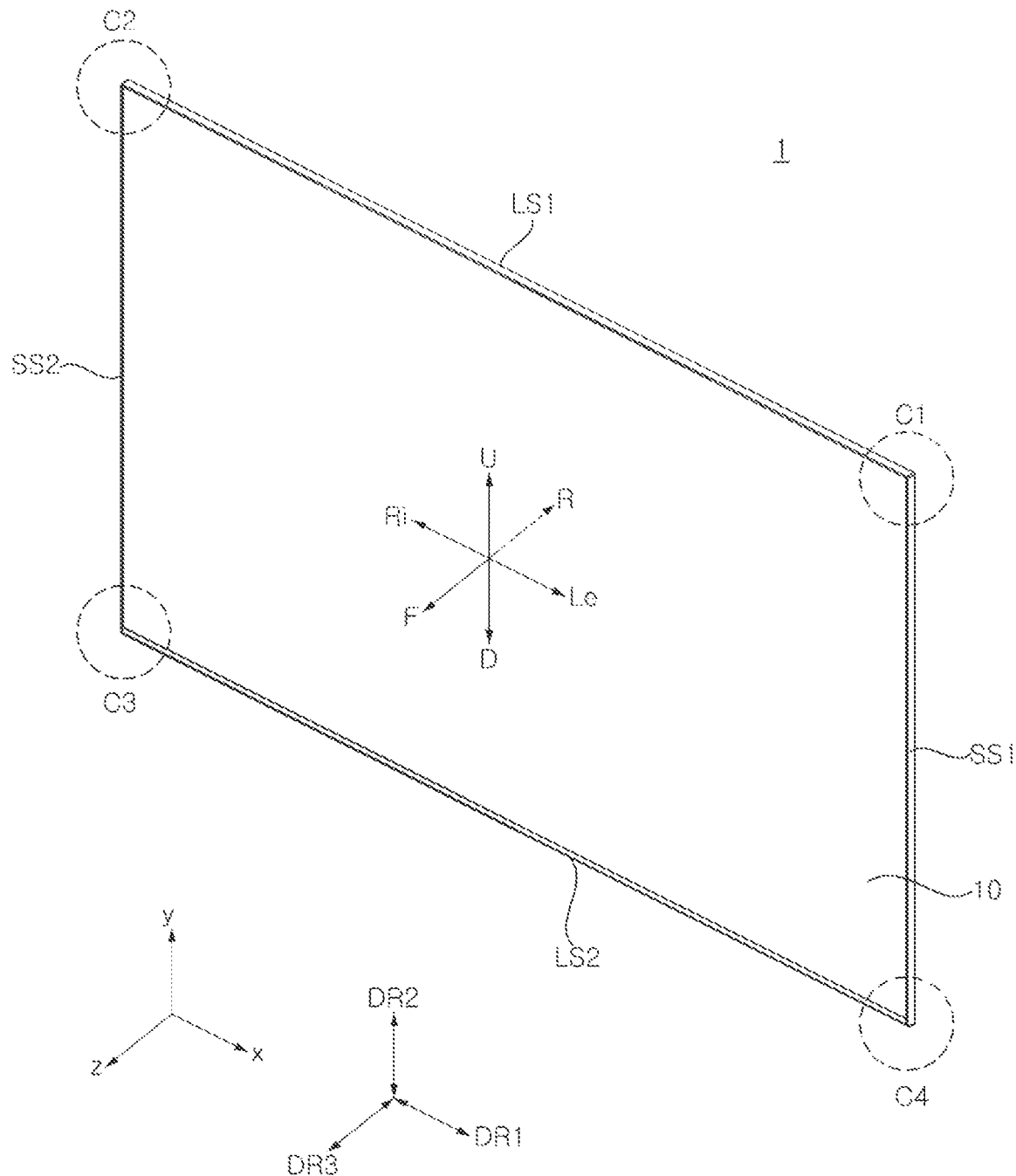

[FIG. 2]
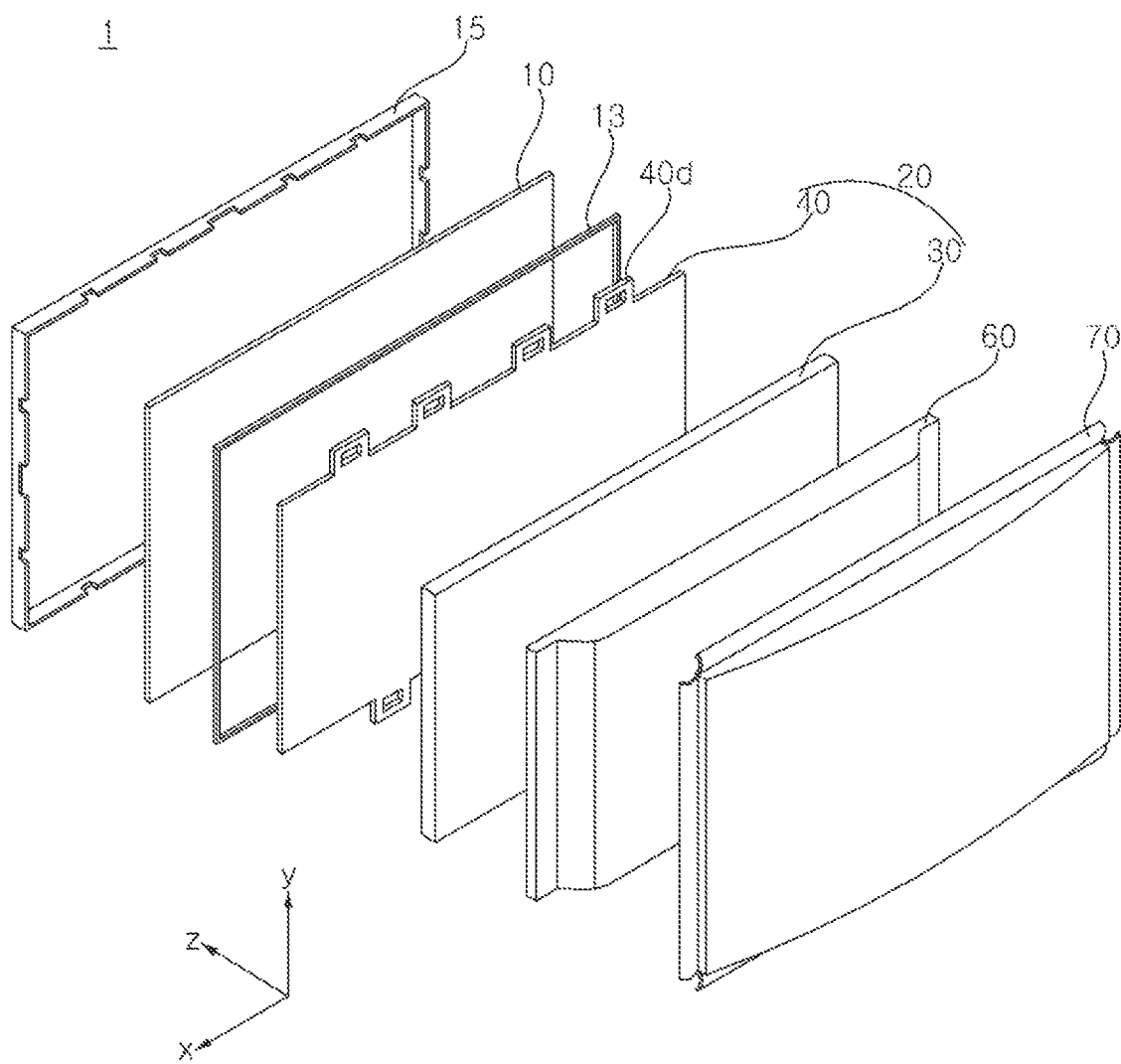

[FIG. 3]
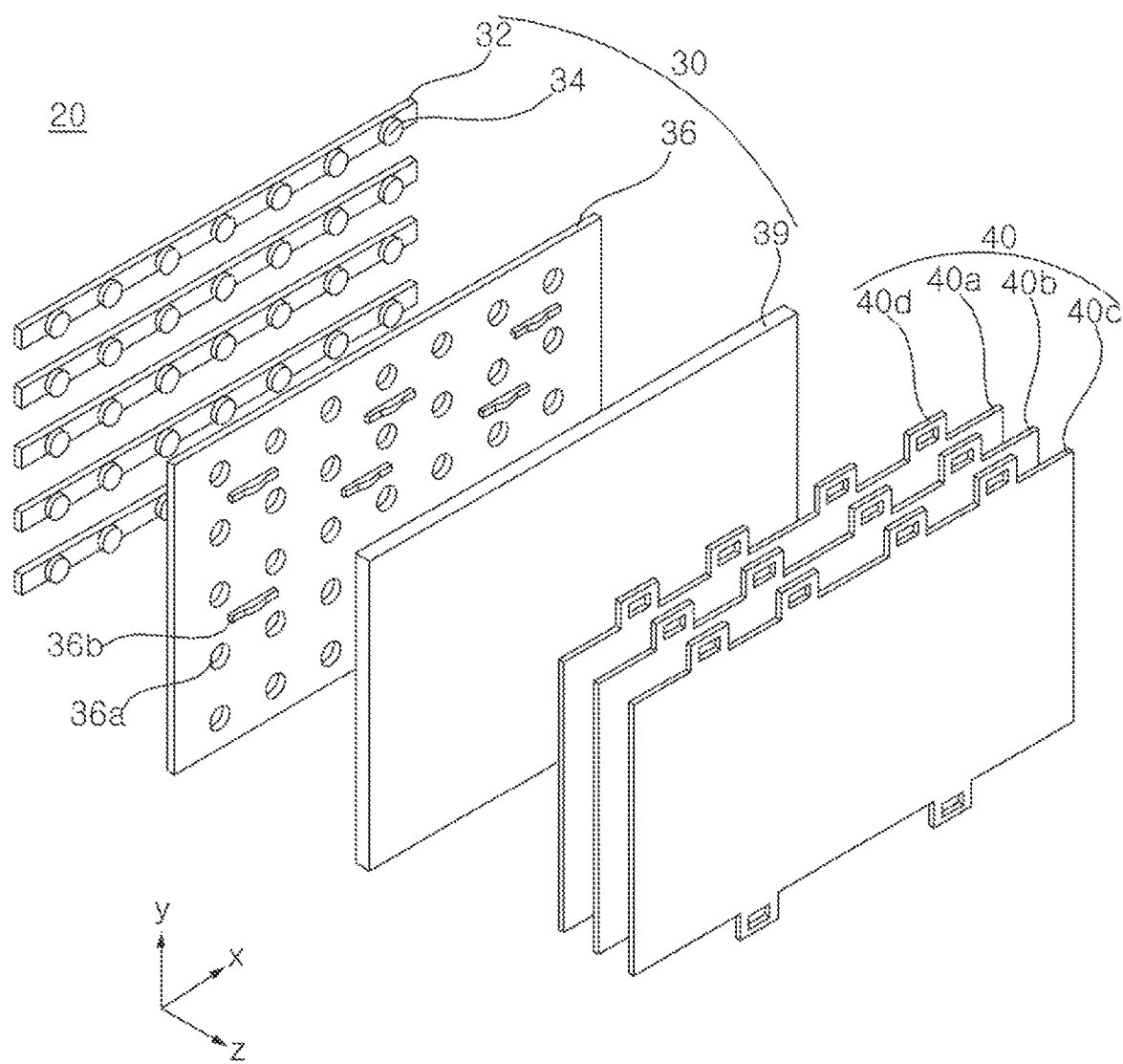

[FIG. 4]
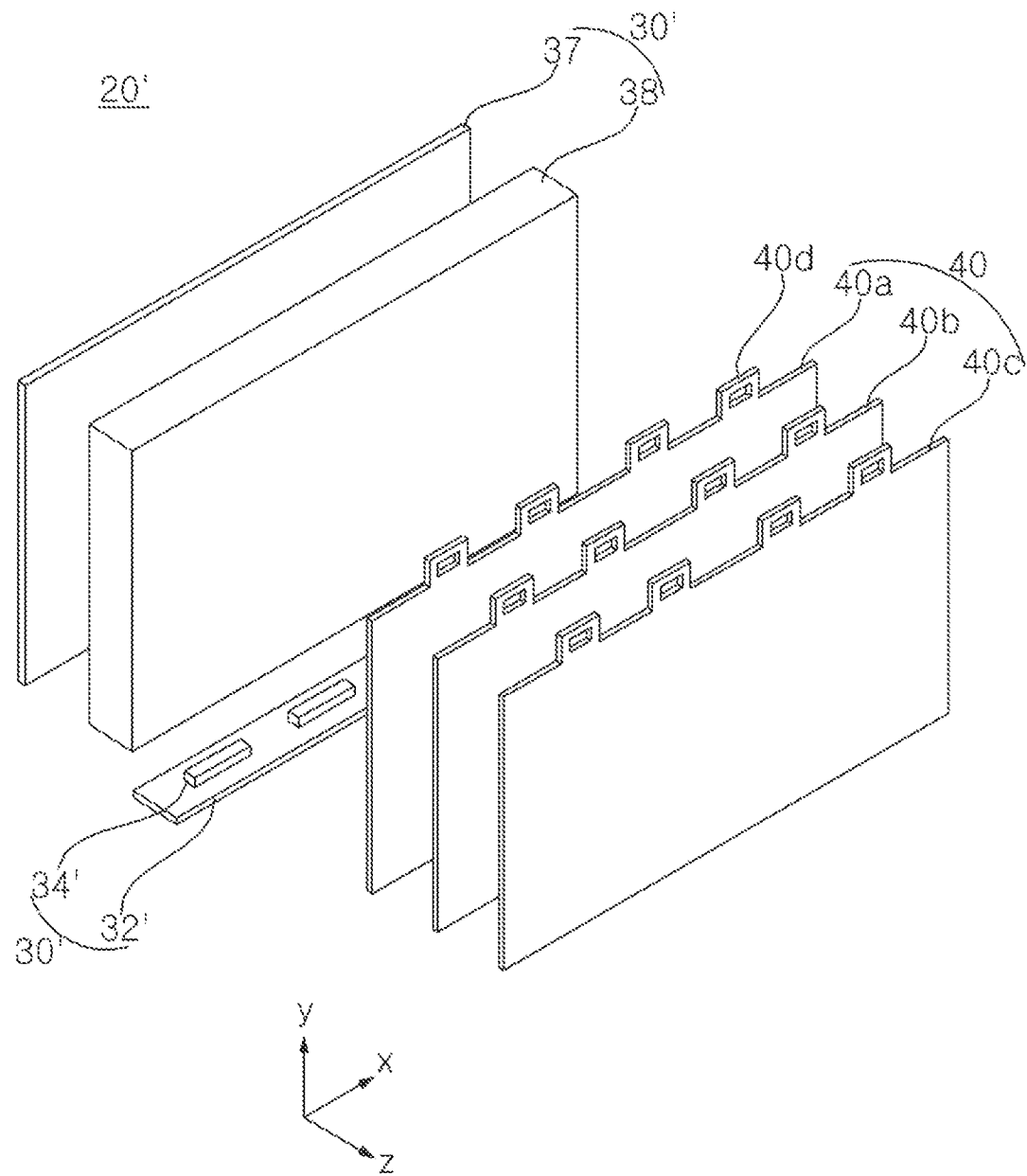

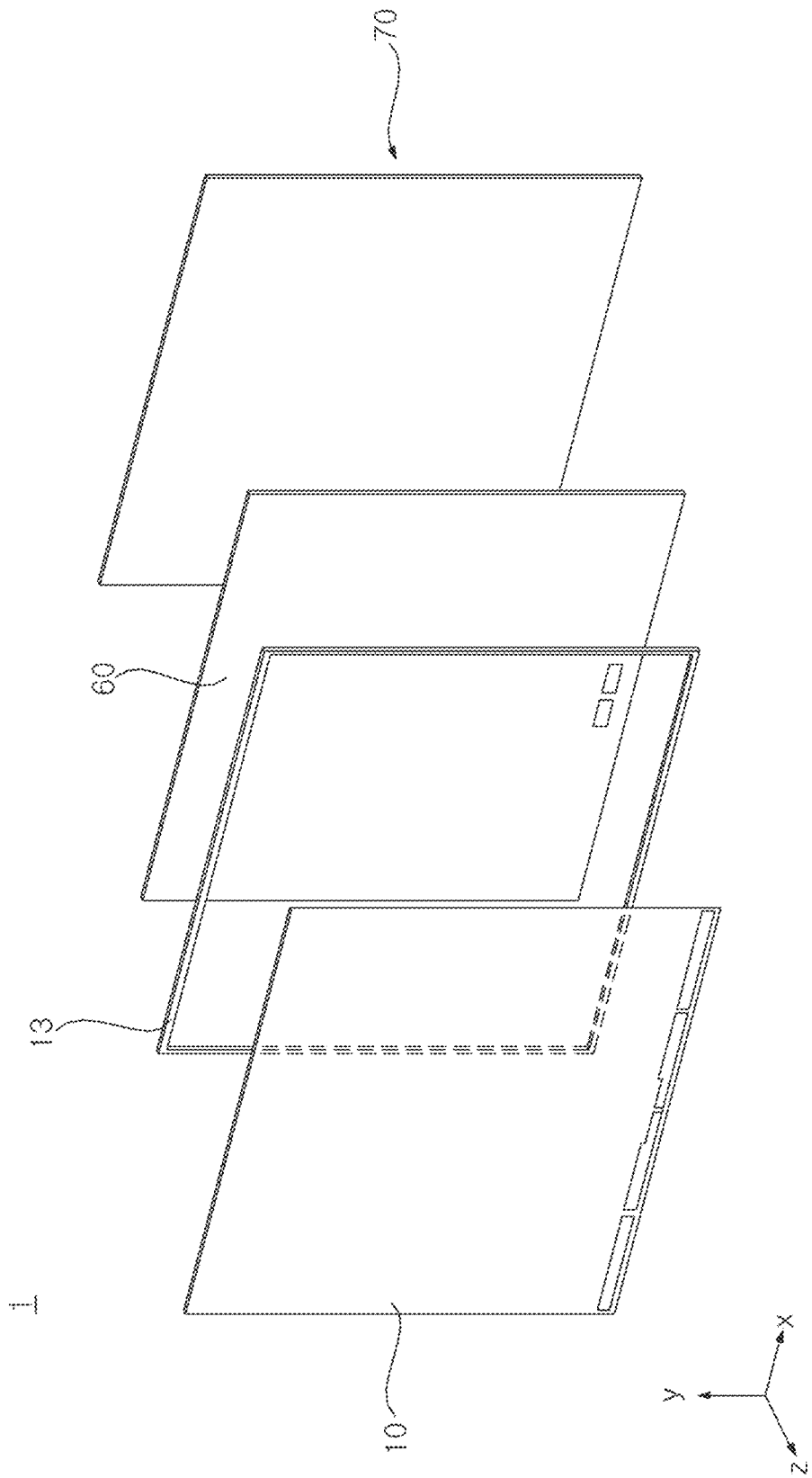

[FIG. 6]
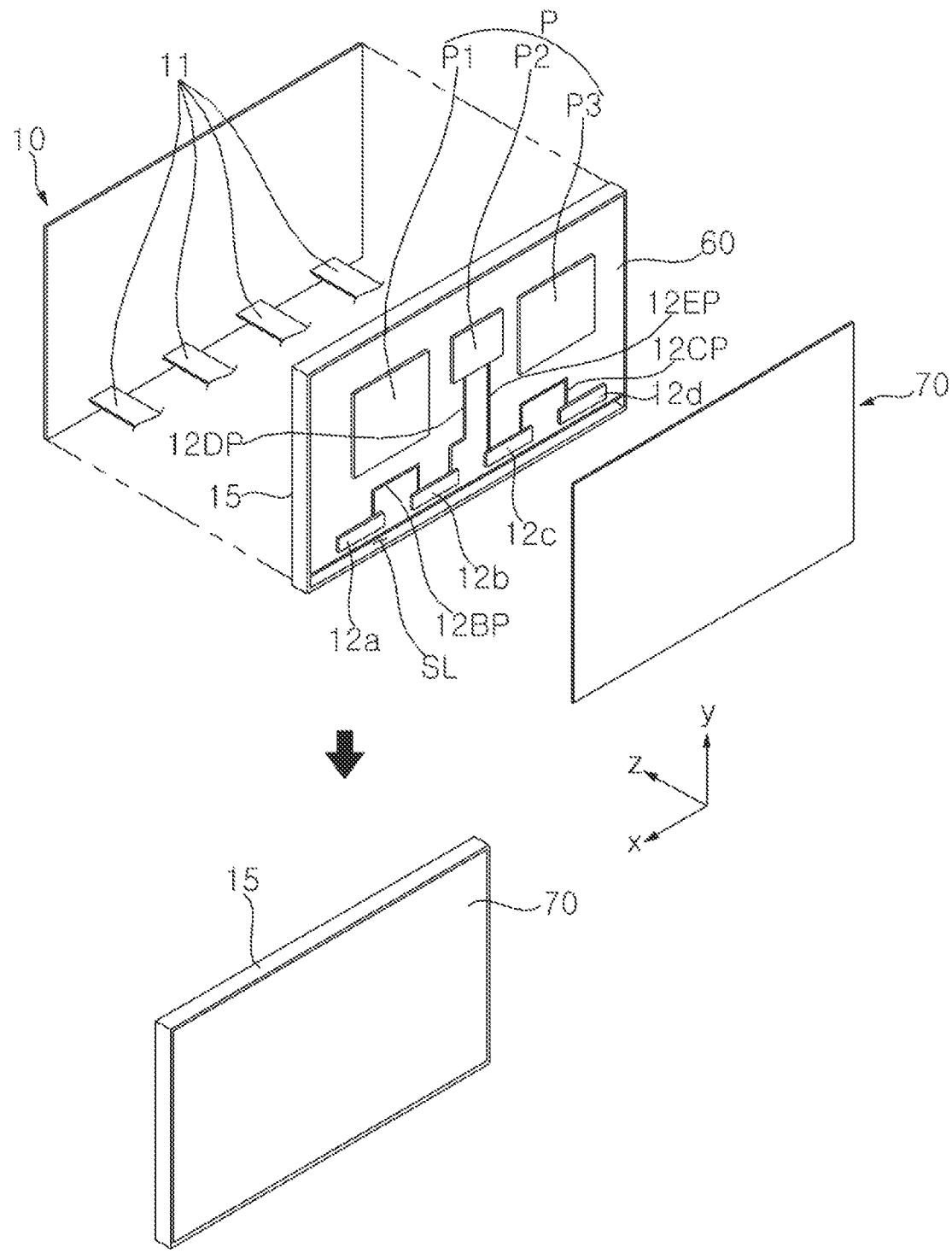

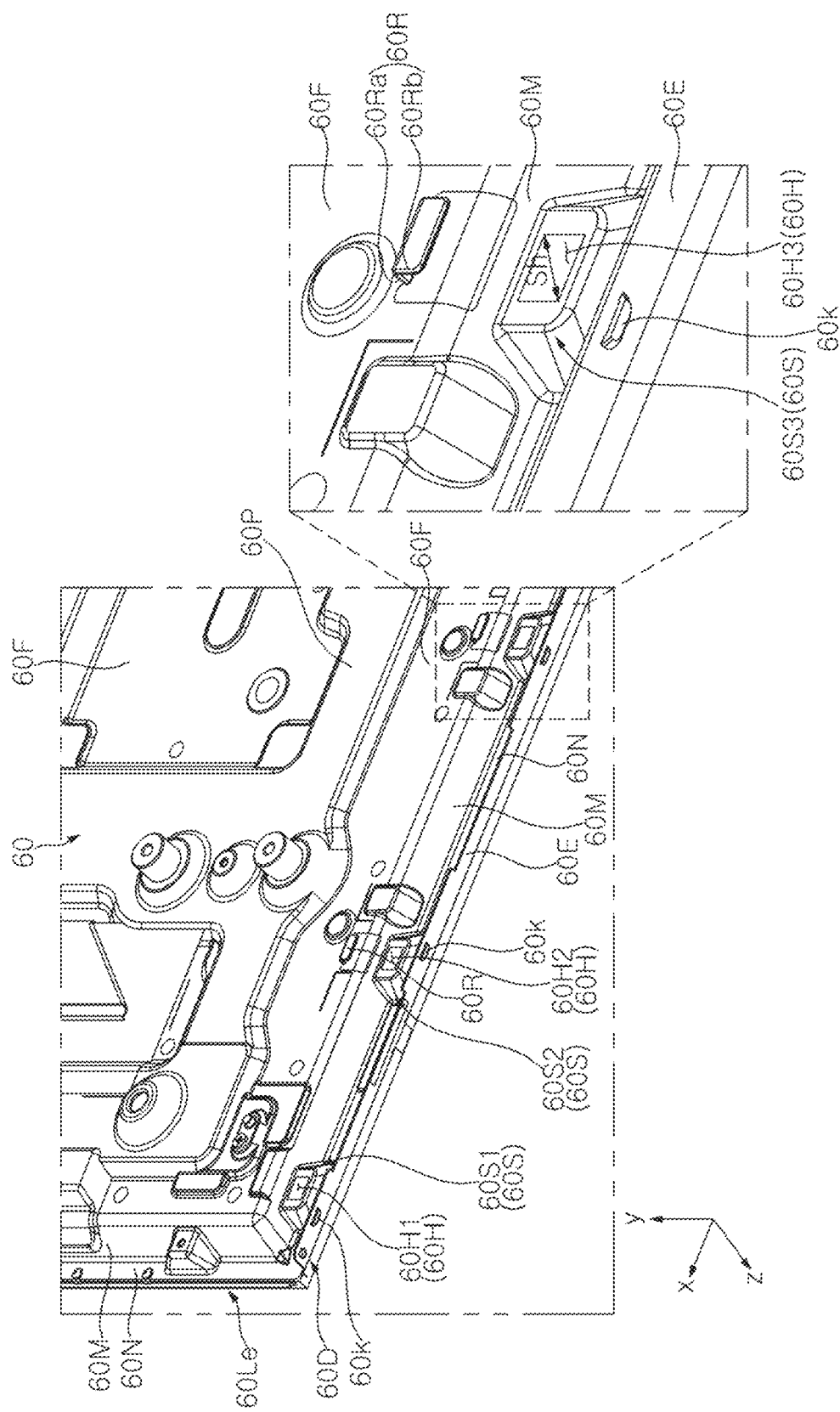

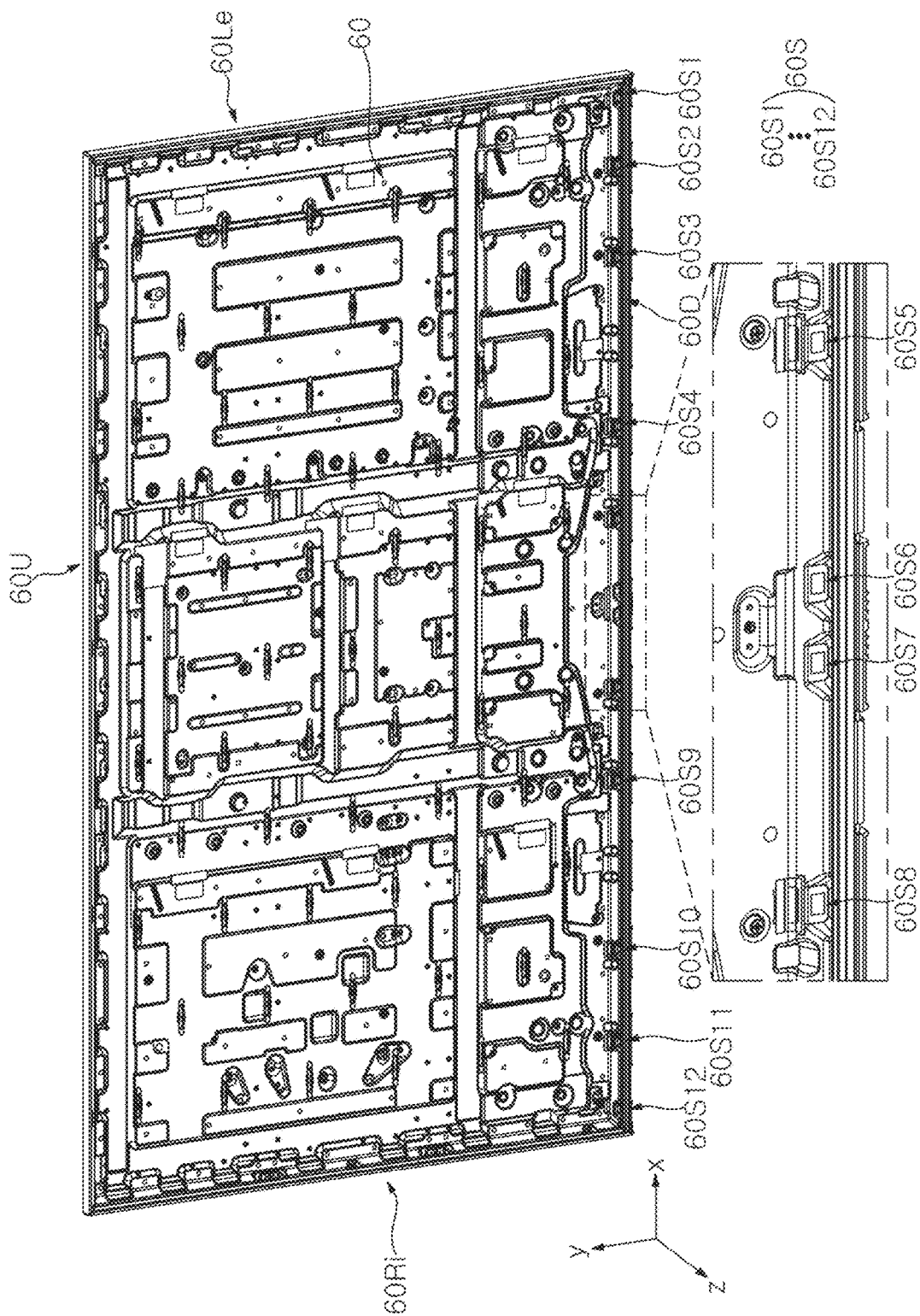

[FIG. 9]
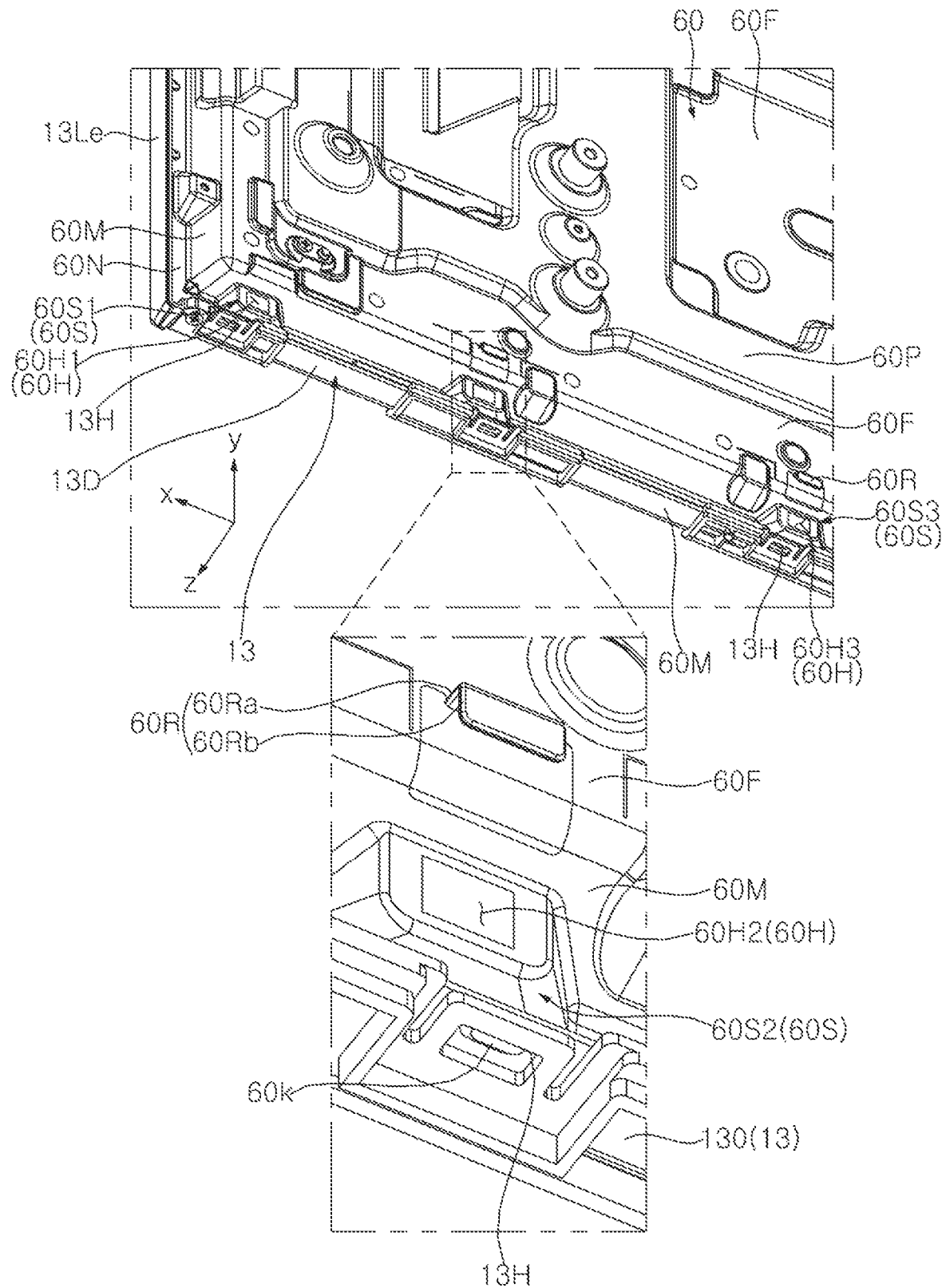

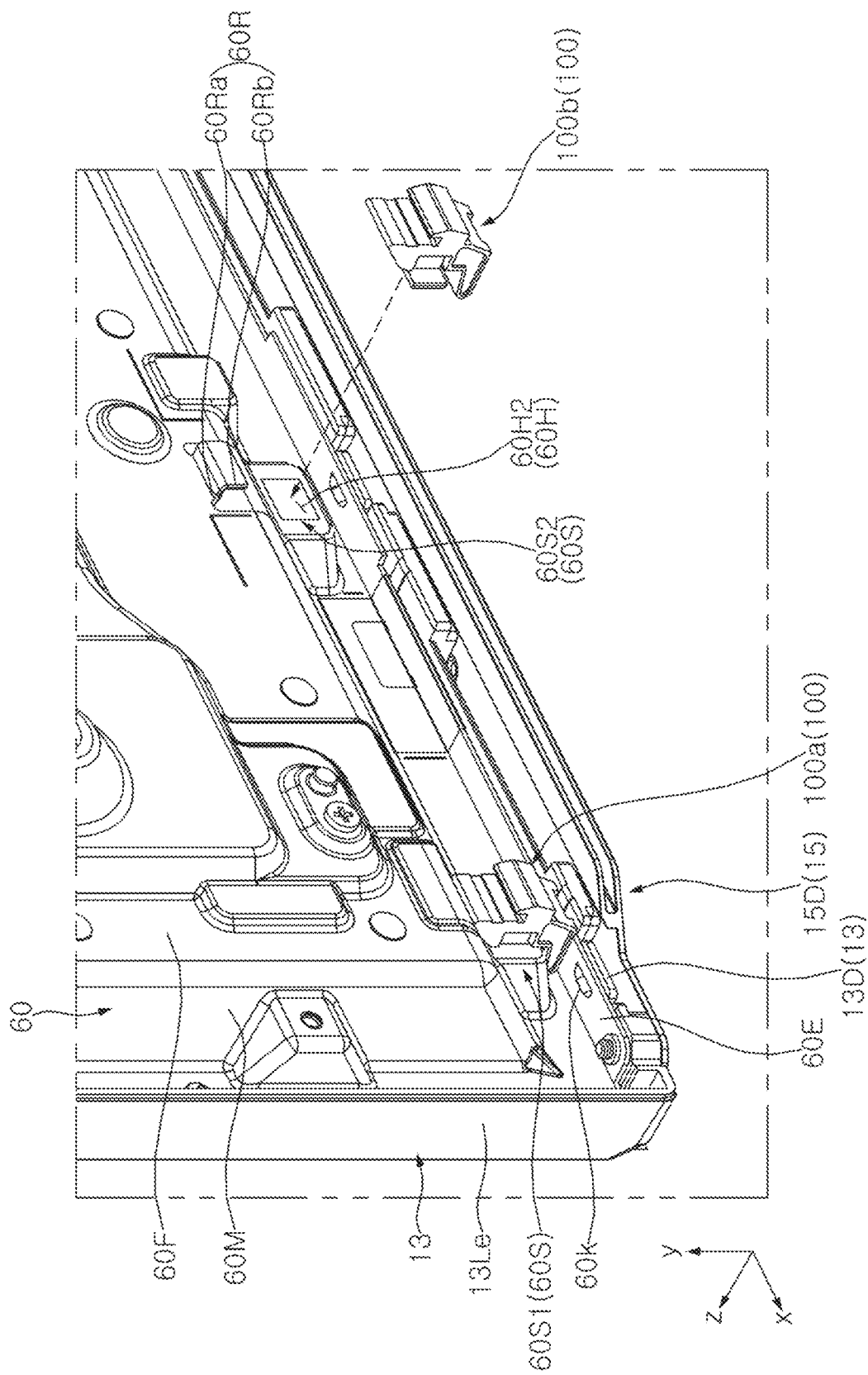
[FIG. 10]

[FIG. 11]
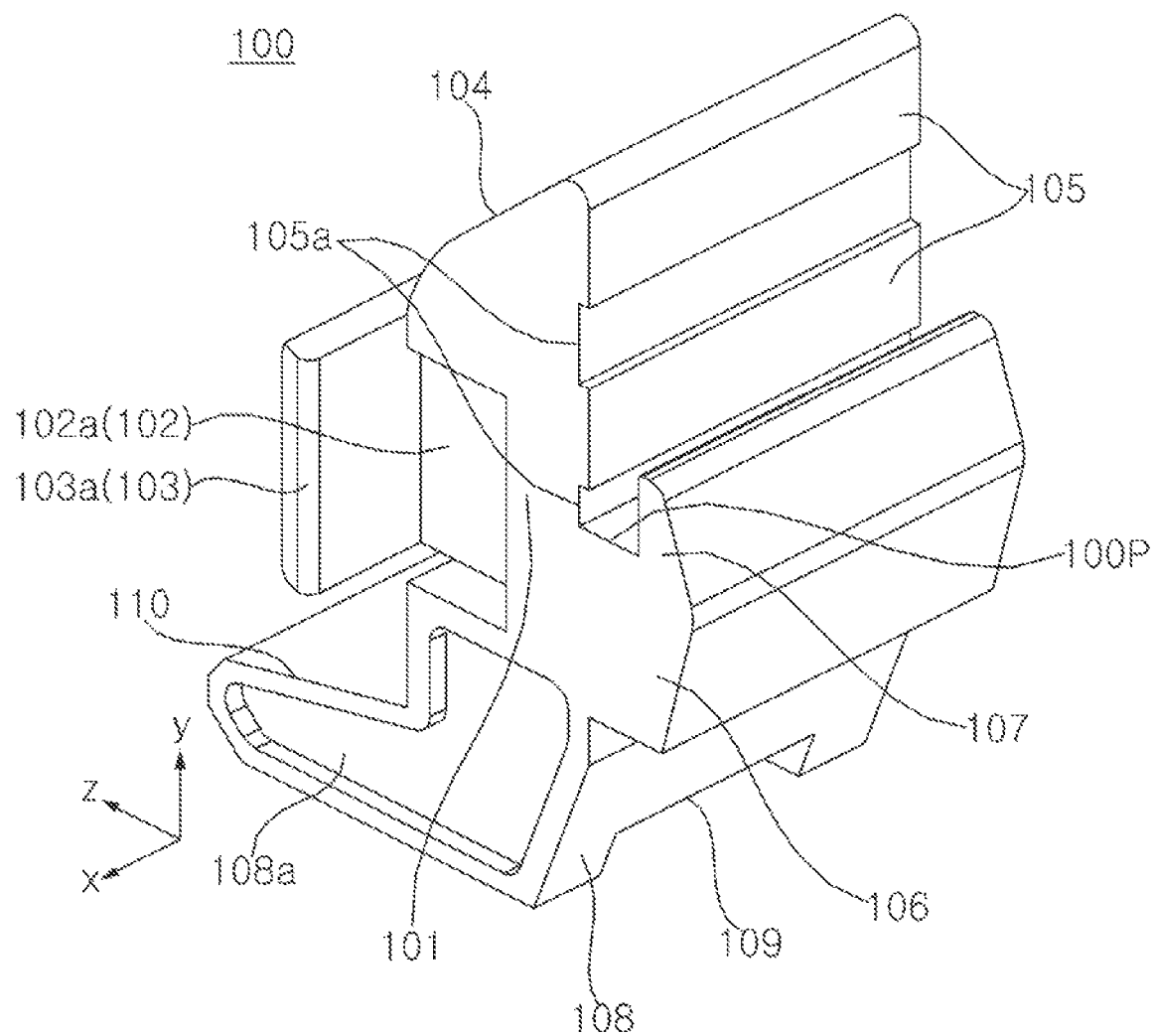

[FIG. 12]
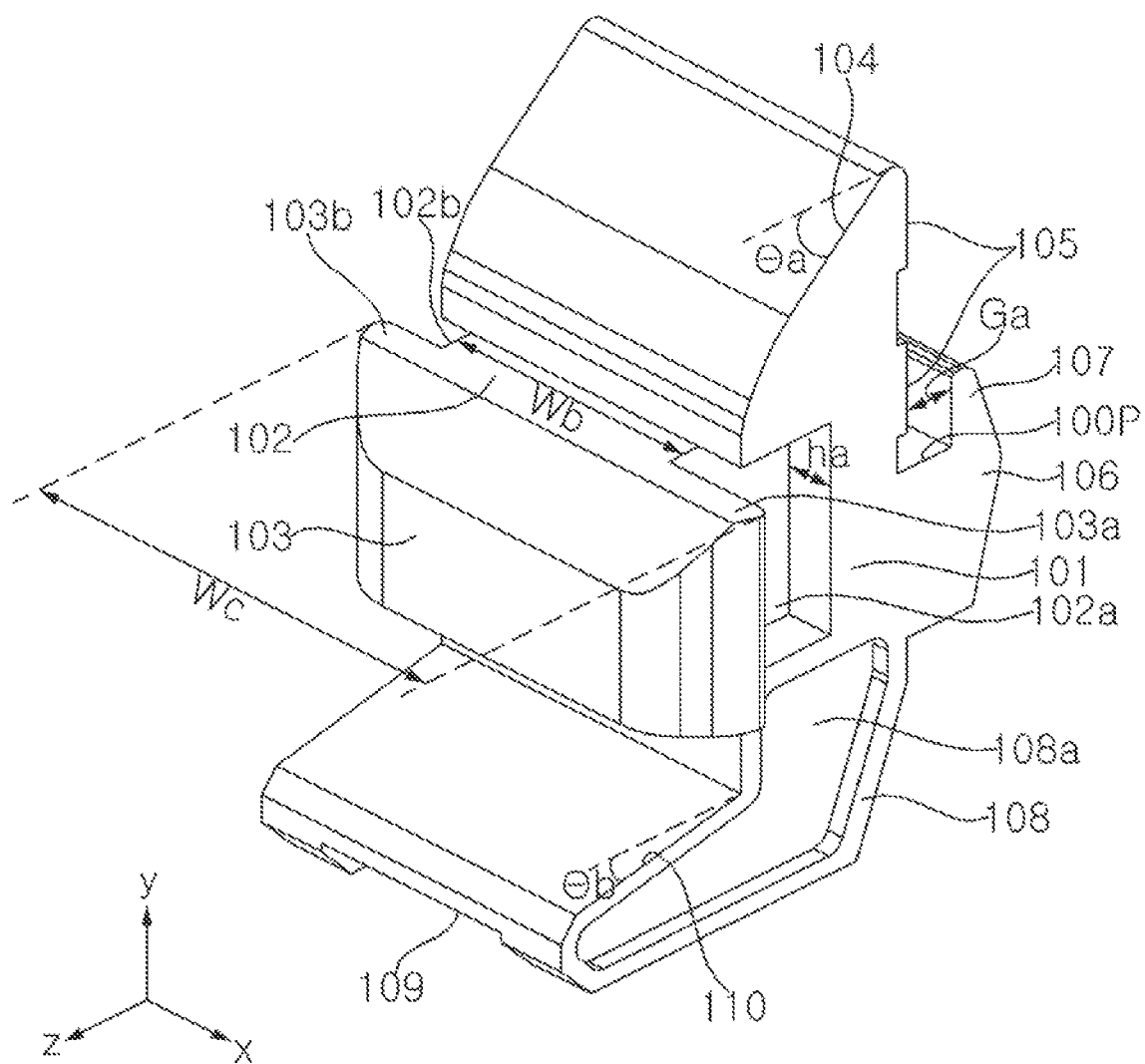

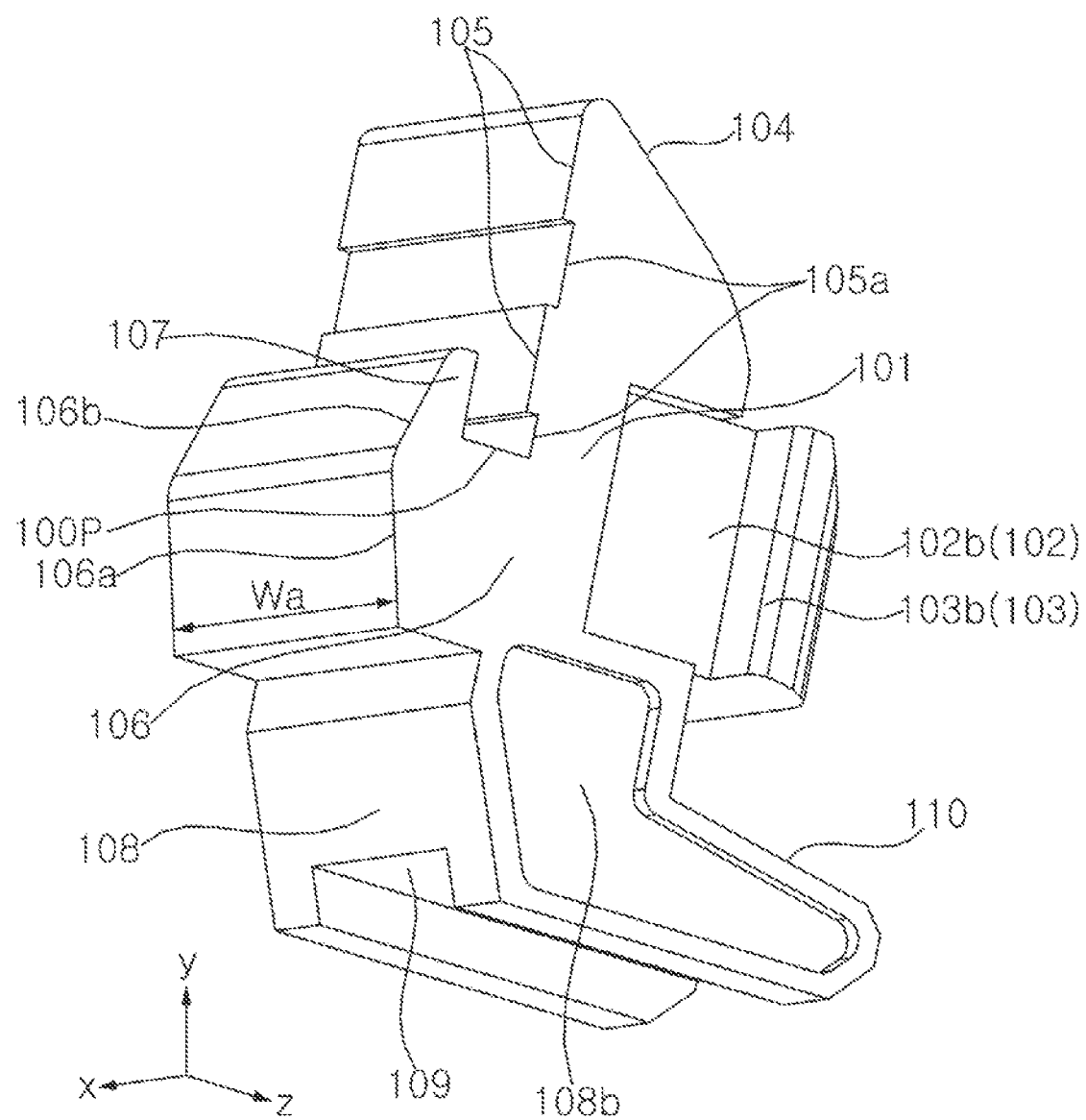
[FIG. 13]

[FIG. 14]
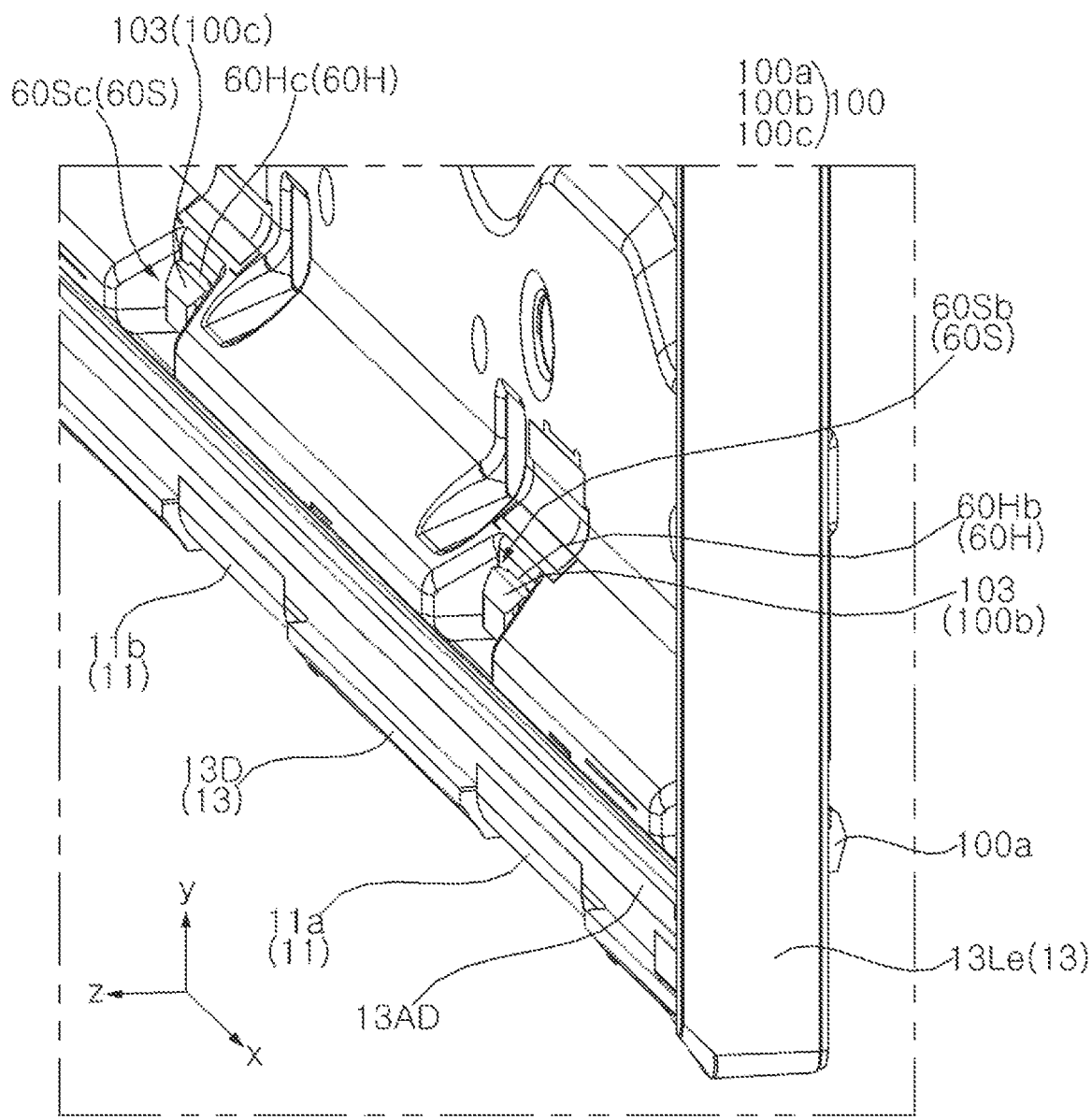

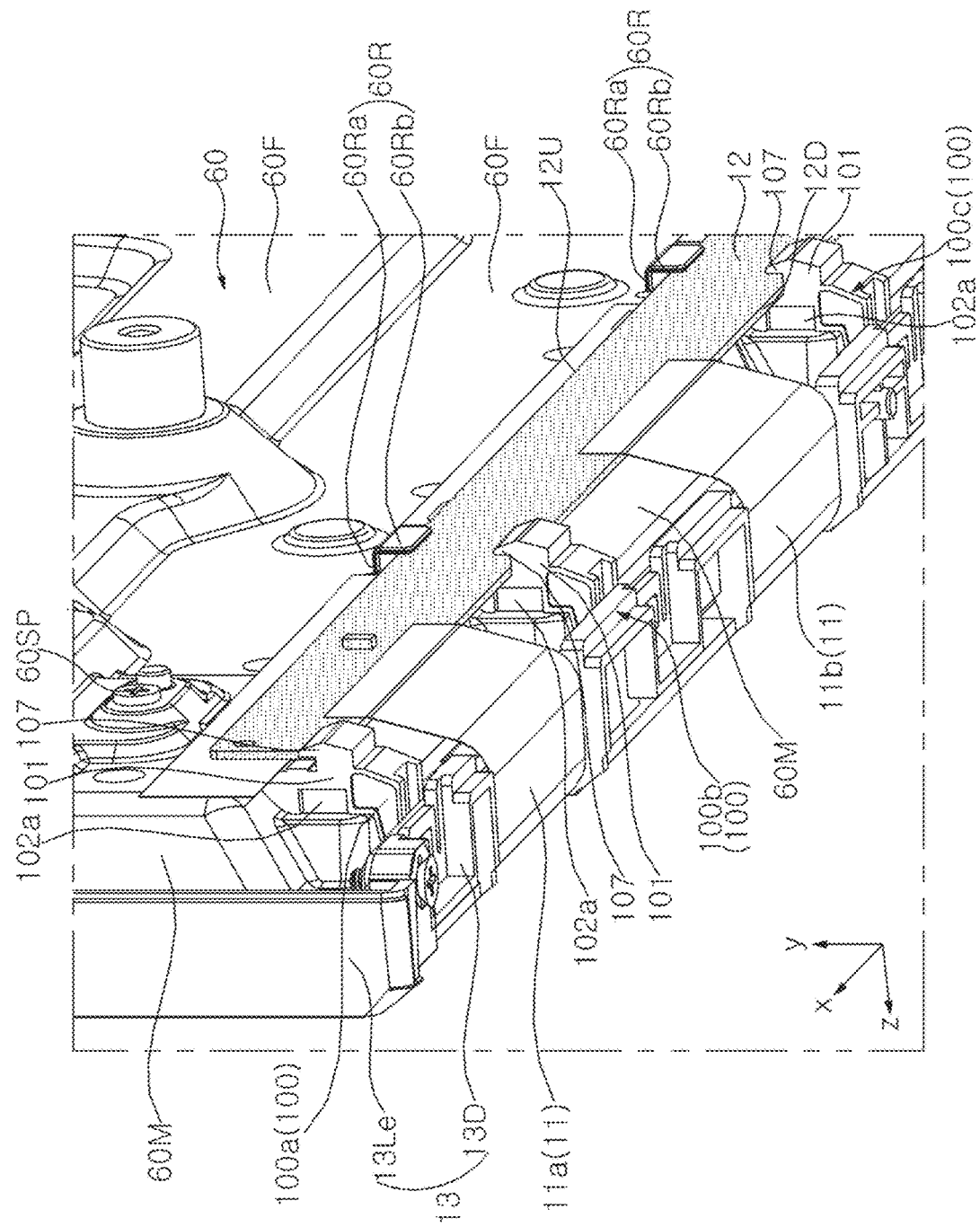
[FIG. 15]

[FIG. 16]
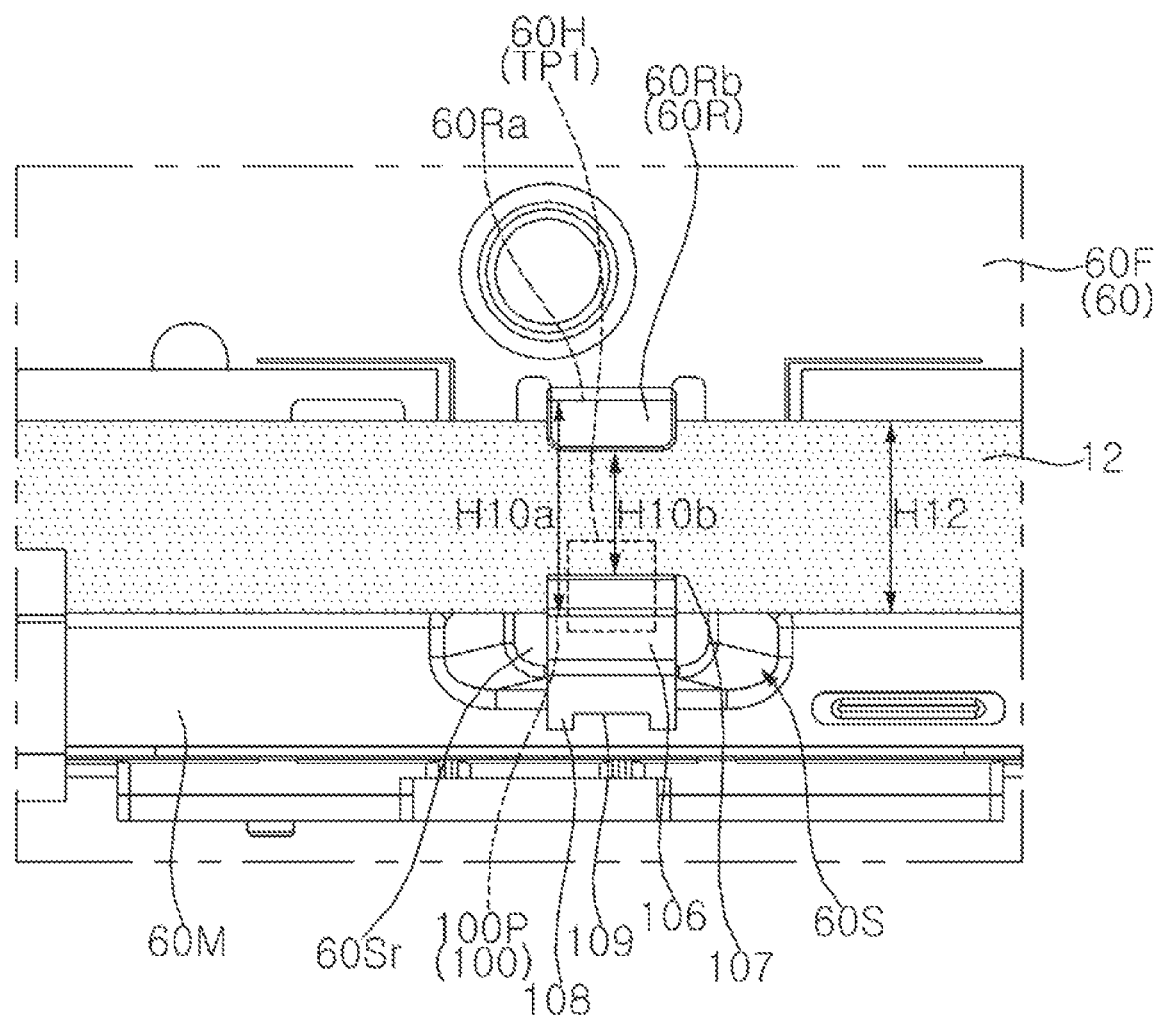

[FIG. 17]
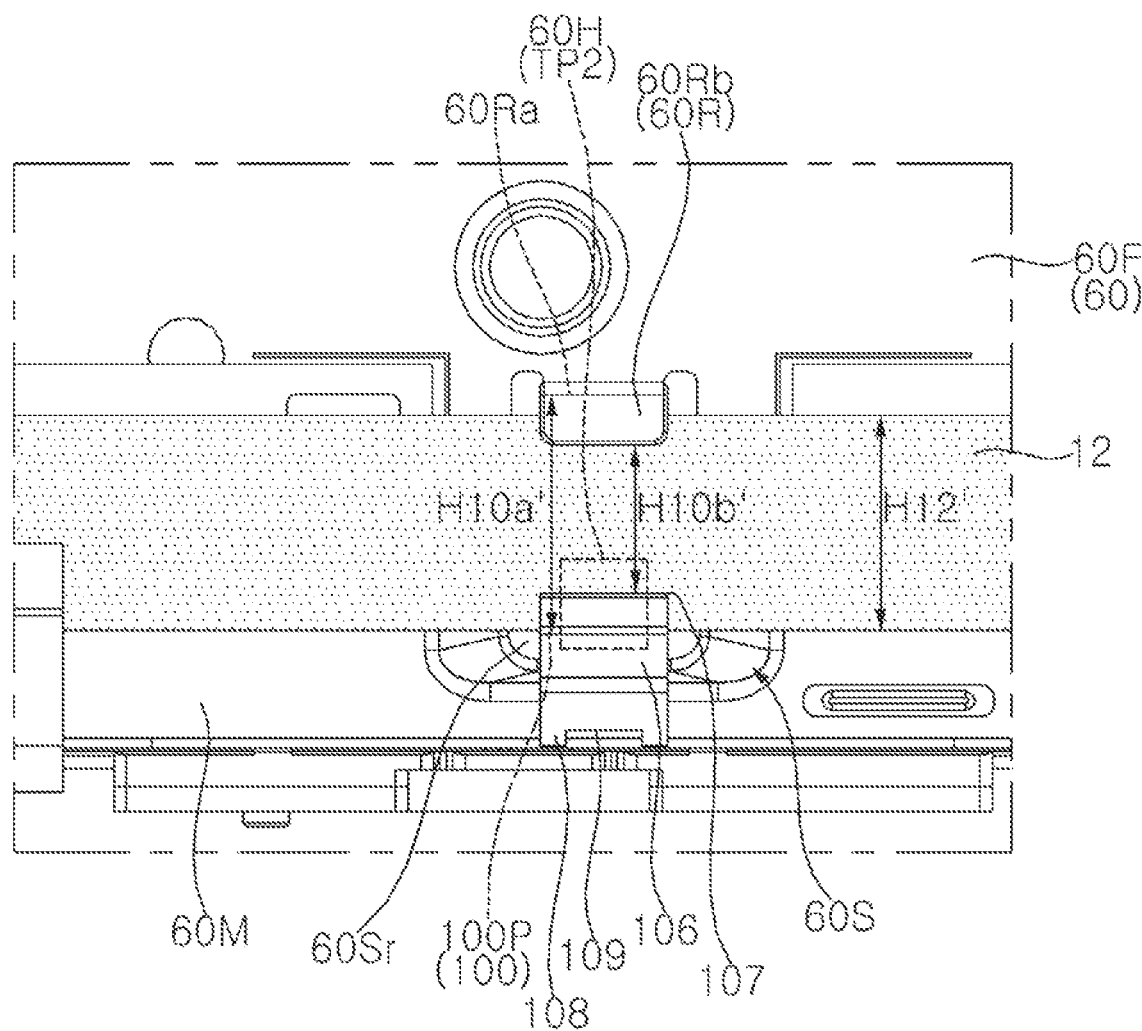

[FIG. 18]
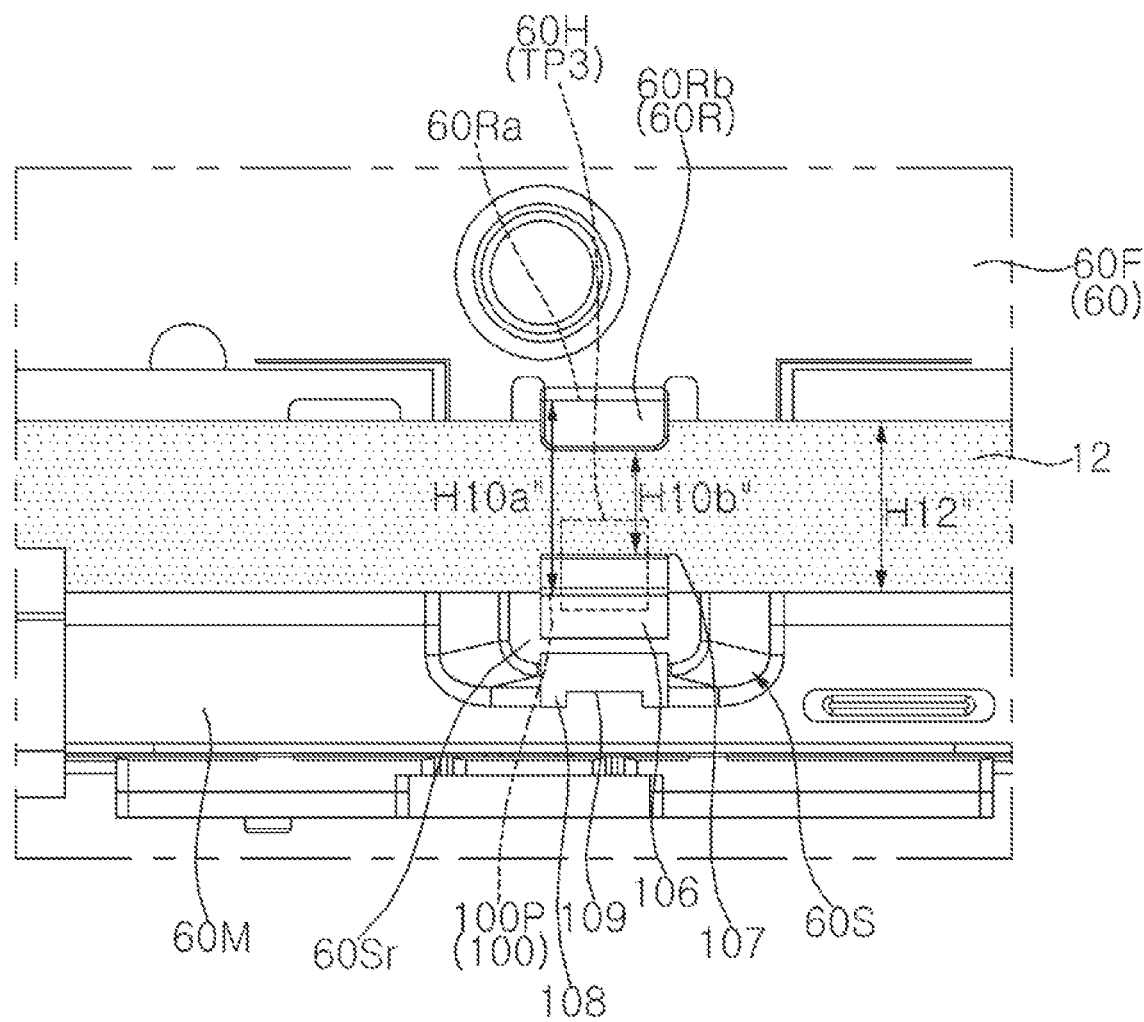

[FIG. 19]
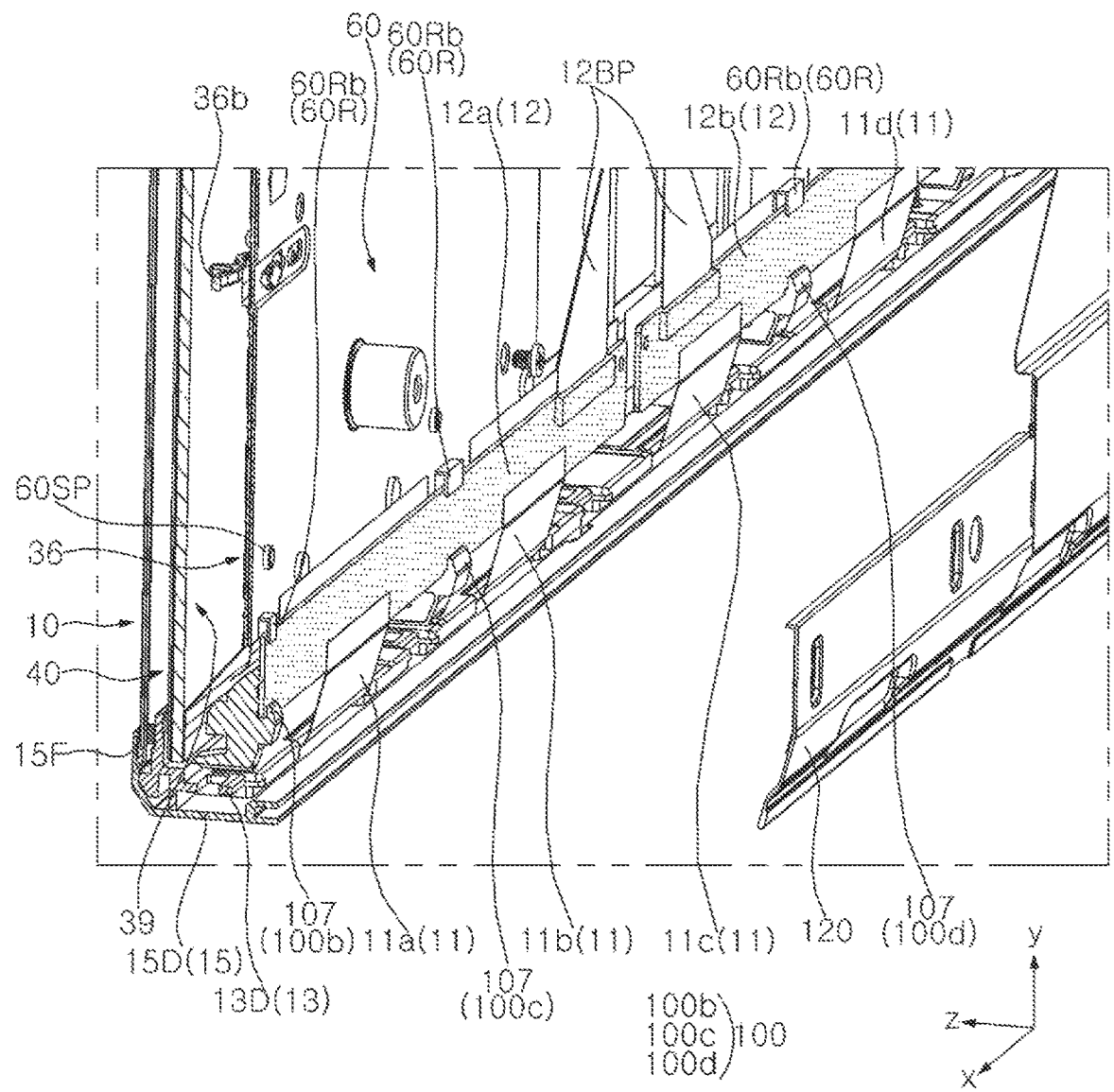

[FIG. 20]
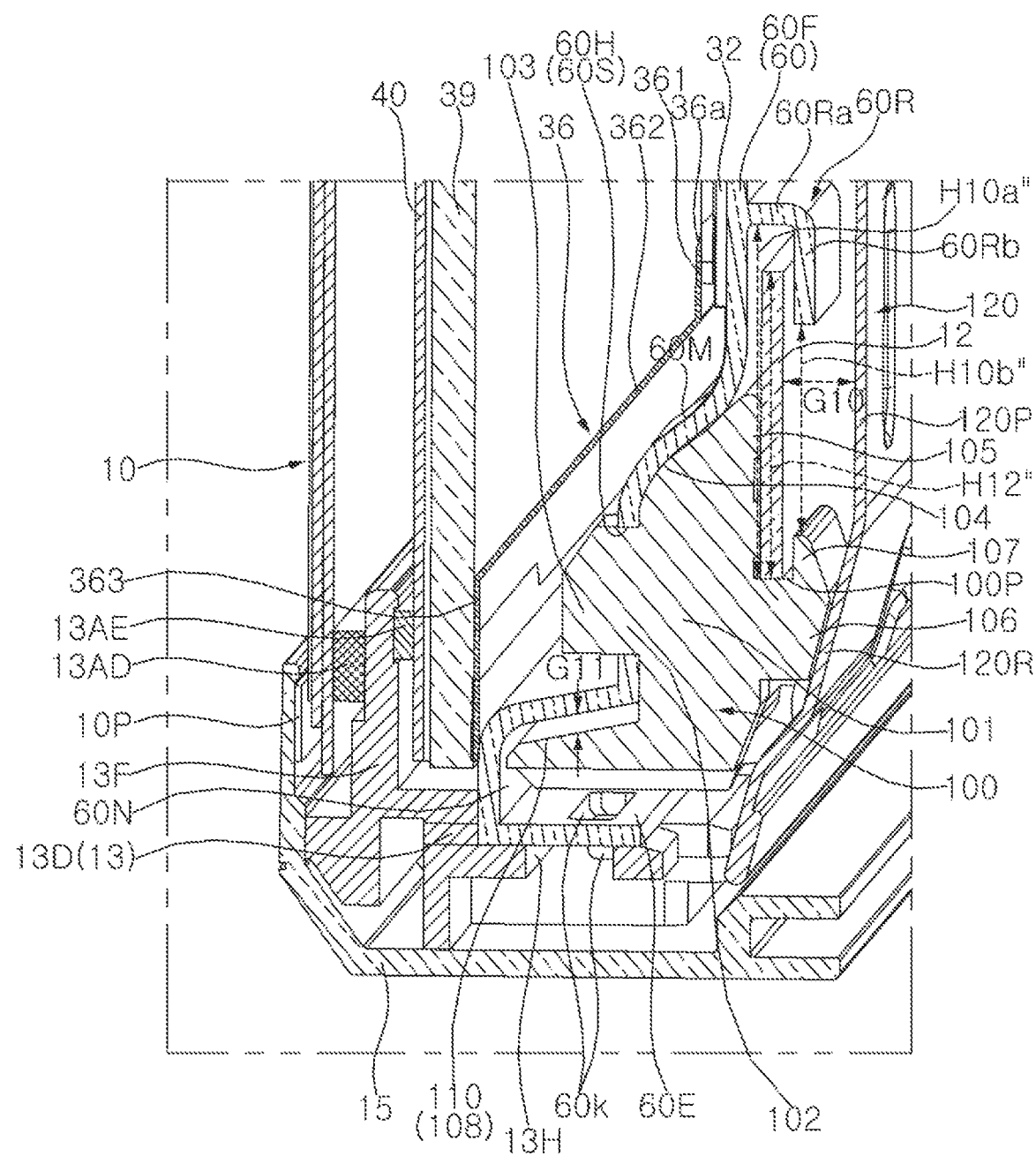

DISPLAY DEVICE

CROSS REFERENCE TO RELATED APPLICATIONS

This application is the National Phase of PCT International Application No. PCT/KR2022/012567, filed on Aug. 23, 2022, which claims priority under 35 U.S.C. 119(a) to Patent Application No. 10-2022-0062086, filed in the Republic of Korea on May 20, 2022, all of which are hereby expressly incorporated by reference into the present application.

TECHNICAL FIELD

The present disclosure relates to a display device.

BACKGROUND ART

With the development of the information society, there have been growing demands for various types of display devices, and in order to meet these demands, various display devices, such as a liquid crystal display (LCD) device, a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color substrate which are positioned opposite each other with a liquid crystal layer interposed therebetween, and displays an image by using light provided by a backlight unit. Further, the OLED panel displays an image by using a self-emitting organic layer deposited on a substrate on which transparent electrodes are formed.

A source PCB provides digital video data and timing control signals, which are received from a timing controller board, to a display panel. The source PCB may have various sizes depending on specifications and manufacturers of display devices, and the like.

However, an existing source PCB fixing structure has a problem in that the structure is designed to fit a source PCB of one specific size, such that it is required to redesign the source PCB fixing structure according to changes in size of the source PCB.

DISCLOSURE OF INVENTION

Technical Problem

It is an objective of the present disclosure to solve the above and other problems.

Another objective may be to provide a source PCB fixing structure commonly applicable to source PCBs of various sizes.

Another objective may be to provide a source PCB fixing structure commonly applicable to cables of various lengths. Here, the cables electrically connect a display panel and source PCBs.

Another objective may be to provide a structure in which a common holder is removably coupled to a frame.

Another objective may be to provide a structure in which by simply changing a position of a slot, into which a common holder is removably coupled, it is possible to easily fit sizes of source PCBs and/or lengths of cables.

Another objective may be to provide a structure capable of allowing a source PCB to be smoothly coupled to or removed from a holder.

Another objective may be to provide a structure capable of improving the rigidity of a portion of a frame at which a holder is mounted.

Another objective may be to provide a structure capable of preventing damage to a source PCB coupled to a holder.

Another objective may be to provide a structure capable of minimizing an increase in thickness of a display device caused by a source PCB fixing structure.

Solution to Problem

In accordance with an aspect of the present disclosure for achieving the above and other objectives, a display device may include: a display panel; a frame which is disposed at a rear of the display panel, and to which the display panel is coupled; a substrate mounted on one surface of the frame; a rib protruding from the frame and by which one side of the substrate is caught; and a holder opposite to the rib with respect to the substrate and by which the other side of the substrate is caught, wherein the holder is detachably coupled to the frame.

The display device may further include a board mounted on the one surface of the frame, wherein the substrate may be a source PCB electrically connected to the display panel and the board.

Advantageous Effects of Invention

The display device according to the present disclosure has the following effects.

According to at least one of the embodiments of the present disclosure, a source PCB fixing structure commonly applicable to source PCBs of various sizes may be provided.

According to at least one of the embodiments of the present disclosure, a source PCB fixing structure commonly applicable to cables of various lengths may be provided. Here, the cables electrically connect a display panel and source PCBs.

According to at least one of the embodiments of the present disclosure, a structure in which a common holder is removably coupled to a frame may be provided.

According to at least one of the embodiments of the present disclosure, there may be provided a structure in which by simply changing a position of a slot, into which a common holder is removably coupled, it is possible to easily fit sizes of source PCBs and/or lengths of cables.

According to at least one of the embodiments of the present disclosure, there may be provided a structure capable of allowing a source PCB to be smoothly coupled to or removed from a holder.

According to at least one of the embodiments of the present disclosure, there may be provided a structure capable of improving the rigidity of a portion of a frame at which a holder is mounted.

According to at least one of the embodiments of the present disclosure, there may be provided a structure capable of preventing damage to a source PCB coupled to a holder.

According to at least one of the embodiments of the present disclosure, there may be provided a structure capable of minimizing an increase in thickness of a display device caused by a source PCB fixing structure.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 20 are diagrams illustrating examples of a display device according to embodiments of the present disclosure.

MODE FOR INVENTION

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

It should be understood that the terms "comprise", "include", "have", etc. when used in this specification, specify the presence of stated features, integers, steps, operations, elements, components, or combinations thereof but do not preclude the presence or addition of one or more other features, integers, steps, operations, elements, components, or combinations thereof.

References to directions, such as up (U), down (D), left (Le), right (Ri), front (F), and rear (R), shown in the drawings are merely for convenience of explanation, and not intended for limiting the scope of the present disclosure.

In the following description, a display panel of the present disclosure may be an LCD panel which will be described below with reference to FIGS. 2 to 4, but the present disclosure may be applied to various types of display panels such as an LED panel.

Referring to FIG. 1, a display device 1 may include a display panel 10. The display panel 10 may display an image.

The display device 1 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the long sides LS1 and LS2 of the display device 1 may be referred to as a left-right direction or a first direction DR1. A direction parallel to the short sides SS1 and SS2 of the display device 1 may be referred to as an up-down direction or a second direction DR2. A direction perpendicular to the long sides LS1 and LS2 and the short sides SS1 and SS2 of the display device 1 may be referred to as a front-rear direction or a third direction DR3.

A side on which the display panel 10 displays an image may be referred to as a front side F, z, and a side opposite thereto may be referred to as a rear side R. The first long side LS1 may be referred to as an upper side U, y, and the second long side LS2 may be referred to as a lower side D. The first short side SS1 may be referred to as a left side Le, x, and the second short side SS2 may be referred to as a right side Ri.

The first long side LS1, the second long side LS2, the first short side SS1, and the second short side SS2 may be referred to as edges of the display device 1. Further, positions where the first long side LS1, the second long side LS2, the first short side SS1, and the second short side SS2 meet each other may be referred to as corners.

For example, a position where the first short side SS1 and the first long side LS1 meet each other may be referred to as a first corner C1. A position where the first long side LS1 and the second short side SS2 meet each other may be referred to as a second corner C2. A position where the second short side SS2 and the second long side LS2 meet each other may be referred to as a third corner C3. A position where the second long side LS2 and the first short side SS1 meet each other may be referred to as a fourth corner C4.

Referring to FIG. 2, the display device 1 may include the display panel 10, a front cover 15, a guide panel 13, a backlight unit 20, a frame 60, and a back cover 70.

The display panel 10 may form a front surface of the display device 1 and may display an image. The display panel 10 may display an image by outputting red, green or blue (RGB) for each pixel by a plurality of pixels on timing. The display panel 10 may be divided into an active area, in which the image is displayed, and a de-active area in which the image is not displayed. The display panel 10 may include a front substrate and a rear substrate which are opposite each other with a liquid crystal layer sandwiched therebetween. The display panel 10 may be referred to as an LCD panel.

The front substrate may include a plurality of pixels made up of red (R), green (G), and blue (B) subpixels. The front substrate may emit light corresponding to red, green, or blue color in response to a control signal.

The rear substrate may include switching elements. The rear substrate may switch on or off pixel electrodes. For example, the pixel electrode may change a molecular arrangement of a liquid crystal layer in response to a control signal received from the outside. The liquid crystal layer may include liquid crystal molecules. The arrangement of the liquid crystal molecules may be changed depending on a voltage difference between the pixel electrode and a common electrode. The liquid crystal layer may transmit light, provided from the backlight unit 20, to the front substrate or may block the light.

A front cover 15 may cover at least a portion of the front surface or a side surface of the display panel 10. The front cover 15 may be divided into a front surface cover disposed on the front surface of the display panel 10, and a side surface cover disposed on the side surface of the display panel 10. The front surface cover and the side surface cover may be provided separately or may be formed as one body. At least one of the front surface cover and the side surface cover may be omitted. The front cover 15 may be referred to as a case top 15 or an outer frame 15.

The guide panel 13 may surround a periphery of the display panel 10 and may cover the side surface of the display panel 10. The guide panel 13 may be coupled to the display panel 10 or may support the display panel 10. The guide panel 13 may be referred to as a middle cabinet 13, a panel guide 13, an inner guide 13, or an inner frame 13.

The backlight unit 20 may be disposed at the rear of the display panel 10. The backlight unit 20 may include a plurality of light sources. The backlight unit 20 may be coupled to the frame 60 at the front of the frame 60. The backlight unit 20 may be driven by a full driving scheme or a partial driving scheme such as local dimming, impulsive driving, or the like. The backlight unit 20 may include an optical sheet 40 and an optical layer 30.

The optical sheet 40 may uniformly transmit light from the light source to the display panel 10. The optical sheet 40 may be composed of a plurality of layers. For example, the optical sheet 40 may include a prism sheet, a diffusion sheet, and the like. For example, the optical sheet 40 may be a Double Brightness Enhance Film (DBEF). Meanwhile, a coupling part 40d of the optical sheet 40 may be coupled to the front cover 15, the frame 60, or the back cover 70.

The frame 60 may be disposed at the rear of the backlight unit 20 and may support components of the display device 1. For example, components, such as the backlight unit 20, a printed circuit board (PCB) on which a plurality of electronic elements are disposed, etc., may be coupled to the frame 60. For example, the frame 60 may be made of a metal material such as an aluminum alloy and the like. The frame 60 may be referred to as a main frame 60, a module cover 60, or a bottom cover 60.

The back cover 70 may cover the rear of the frame 60. The back cover 70 may be coupled to the frame 60 and/or the front cover 15. For example, the back cover 70 may be an injection-molded product of a resin material. In another example, the back cover 70 may be made of a metal material.

Referring to FIG. 3, the backlight unit 20 may include the optical layer 30 and the optical sheet 40. The optical layer 30 may include a substrate 32, at least one light source 34, a reflective sheet 36, and a diffusion plate 39.

The substrate 32 may be coupled to a front surface of the frame 60. The substrate 32 may have a plate shape or may have a plurality of straps that are vertically spaced apart from each other. The substrate 32 may be made of at least one of polyethylene terephthalate (PET), glass, polycarbonate (PC), and silicon.

The substrate 32 may be a printed circuit board (PCB).

At least one light source 34 may be mounted on the substrate 32. A plurality of light sources 34 may be spaced apart from each other on the substrate 32. An electrode pattern for connecting an adapter and the light source 34 may be formed on the substrate 32. For example, a carbon nano tube (CNT) electrode pattern for connecting an adapter and the light source 34 may be formed on the substrate 32.

For example, the light source 34 may be a light emitting diode (LED) chip or an LED package including at least one LED chip. The light source 34 may be configured as a white LED or a colored LED emitting light of at least one of red, green, and blue color, and the like. The colored LED may include at least one of a red LED, a green LED, and a blue LED. The light source 34 may be referred to as an optical assembly 34.

The reflective sheet 36 may be disposed at the front of the substrate 32. The reflective sheet 36 may be disposed on a region of the substrate 32, except a region where the light source 34 is formed. The reflective sheet 36 may have a hole 36a in which the light source 34 is disposed.

Further, the reflective sheet 36 may include at least one of a metal and metal oxide as reflective materials. For example, the reflective sheet 36 may include a metal and/or metal oxide having high reflectance, such as at least one of aluminum (Al), silver (Ag), gold (Au), and titanium dioxide (TiO2). For example, the resin may be deposited or applied on the light source 34 and/or the reflective sheet 36. The resin may serve to diffuse light from the light source 34. Accordingly, the reflective sheet 36 may reflect the light from the light source 34 or the light reflected from the diffusion plate 39 forward.

The diffusion plate 39 may be disposed at the front of the reflective sheet 36. The diffusion plate 39 may diffuse light from the light source 34. A spacer 36b may be disposed between the reflective sheet 36 and the diffusion plate 39 and may support a rear surface of the diffusion plate 39. Accordingly, an air gap may be formed between the reflective sheet 36 and the diffusion plate 39 and the light of the light source 34 may be spread widely by the air gap.

The optical sheet 40 may be disposed at the front of the diffusion plate 39. A rear surface of the optical sheet 40 may come into close contact with the diffusion plate 39, and a front surface of the optical sheet 40 may come into close contact with or may be adjacent to a rear surface of the display panel 10. The optical sheet 40 may include at least one sheet.

For example, the optical sheet 40 may include a plurality of sheets having different functions. A first optical sheet 40a may be a diffusion sheet, and a second optical sheet 40b and a third optical sheet 40c may be prism sheets. The diffusion sheet may prevent light, emitted from the diffusion plate 39, from being partially concentrated, thereby providing uniform distribution of light. The prism sheet may collect light from the diffusion sheet 39 and may provide the light to the display panel 10. Meanwhile, the number and/or position of the diffusion sheet and the prism sheet may vary.

The coupling part 40d may be formed on at least one edge of the optical sheet 40. The coupling part 40d may be formed on at least one of the first optical sheet 40a, the second optical sheet 40b, or the third optical sheet 40c.

Referring to FIG. 4, a backlight unit 20' may include an optical layer 30' and the optical sheet 40. The optical layer 30' may be disposed between the frame 60 and the display panel 10. The optical layer 30' may be supported by the frame 60. The optical layer 30' may include a substrate 32', at least one light source 34', a reflective sheet 37, and a light guide plate 38.

The light guide plate 38 may be disposed between the frame 60 and the optical sheet 40 and may be supported by the frame 60.

The substrate 32' may be adjacent to a periphery of the light guide plate 38, and may be coupled to one side of the guide panel 13. For example, the substrate 32' may be adjacent to a lower side of the light guide plate 38. The substrate 32' may be made of at least one of polyethylene terephthalate (PET), glass, polycarbonate (PC), and silicon. The substrate 32' may be a printed circuit board (PCB).

At least one light source 34' may be mounted on the substrate 32'. A plurality of light sources 34' may be spaced apart from each other on the substrate 32'. An electrode pattern for connecting an adapter and the light sources 34' may be formed on the substrate 32'. For example, a carbon nano tube electrode pattern for connecting the light sources 34' and an adapter may be formed on the substrate 32'.

For example, the light source 34' may be a light emitting diode (LED) chip or an LED package including at least one LED chip. The light source 34' may be configured as a white LED or a colored LED emitting light of at least one of red, green, and blue color, and the like. The colored LED may include at least one of a red LED, a green LED, and a blue LED. The light source 34' may be referred to as an optical assembly 34'.

The reflective sheet 37 may be disposed between the frame 60 and the light guide plate 38, and may be supported by the frame 60. The reflective sheet 37 may include at least one of a metal and metal oxide which are reflective materials. For example, the reflective sheet 37 may include a metal and/or metal oxide having high reflectance, such as at least one of aluminum (Al), silver (Ag), gold (Au), and titanium dioxide (TiO2).

Accordingly, the light source 34' may provide light to the edge of the light guide plate 38. Light entering the light guide plate 38 may be directed forward by the light guide plate 38 and the reflective sheet 37.

Referring to FIG. 5, the display device 1 may include the display panel 10, the guide panel 13, the frame 60, and the back cover 70.

The display panel 10 may form a front surface of the display device 1 and may display an image. The display panel 10 may divide an image into a plurality of pixels and may output the image while controlling color, brightness, and chroma of the respective pixels. The display panel 10 may be divided into an active area, in which an image is displayed, and a de-active area in which the image is not displayed. The display panel 10 may generate light corresponding to red, green, or blue color in response to a control signal. The display panel 10 may be referred to as an OLED panel.

The guide panel 13 may surround a periphery of the display panel 10 and may cover a side surface of the display panel 10. The guide panel 13 may be coupled to the display panel 10 or may support the display panel 10. The guide panel 13 may be referred to as a middle cabinet 13, a panel guide 13, or an inner frame 13.

The frame 60 may be disposed at the rear of the display panel 10, and the display panel 10 may be coupled thereto. Edges of the frame 60 may be fixed to the guide panel 13. Electronic parts may be mounted to the frame 60. For example, the frame 60 may include a metal material such as an aluminum alloy and the like. The frame 60 may be referred to as a main frame 60, a module cover 60, or a bottom cover 60.

The back cover 70 may cover the rear of the frame 60. The back cover 70 may be coupled to the frame 60. For example, the back cover 70 may be an injection-molded product of a resin material. In another example, the back cover 70 may include a metal material.

Referring to FIG. 6, a board P may be mounted on a rear surface of the frame 60. A plurality of electronic elements may be mounted on the board P. The board P may be a printed circuit board (PCB) and may be electrically connected to electronic parts of the display device. Meanwhile, the board P, source PCBs 12a, 12b, 12c, and 12d, and a holder 100 (see FIG. 10) which will be described below may be mounted on a front surface of the frame 60.

A plurality of boards P1, P2, and P3 may be mounted on the rear surface of the frame 60. A power supply board P1 may supply power to the respective components of the display device. A timing controller board P2 may provide an image signal to the display panel 10. A main board P3 may control the respective components of the display device. For example, the power supply board P1 may be adjacent to the left side of the frame 60, the main board P3 may be adjacent to the right side of the frame 60, and the timing controller board P2 may be disposed between the power supply board P1 and the main board P3.

A first cable 11 may be adjacent to the lower side of the display panel 10 and may be electrically connected to the display panel 10. The first cable 11 may pass through a slit SL formed in the lower side of the frame 60. Alternatively, the first cable 11 may pass through a cable hole (not shown) formed in the frame 60. For example, the first cable 11 may be a Chip On Film (COF).

The source PCBs 12a, 12b, 12c, and 12d may be adjacent to the lower side of the frame 60 and may be coupled to the rear surface of the frame 60. The source PCBs 12a, 12b, 12c, and 12d may be referred to as S-PCBs 12a, 12b, 12c, and 12d. The source PCBs 12a, 12b, 12c, and 12d may be electrically connected to the first cable 11. For example, a plurality of source PCBs 12a, 12b, 12c, and 12d may be spaced apart from each other along the lower side of the frame 60 and may be electrically connected to the plurality of first cables 11.

Second cables 12BP, 12CP, 12DP, and 12EP may be disposed at the rear of the frame 60 and may be electrically connected to the source PCBs 12a, 12b, 12c, and 12d and the timing controller board P2. A first bridge cable 12BP may electrically connect a first source PCB 12a and a second source PCB 12b, and a second bridge cable 12CP may electrically connect a third source PCB 12c and a fourth source PCB 12d. A first connecting cable 12DP may electrically connect the second source PCB 12b and the timing controller board P2, and a second connecting cable 12EP may electrically connect the third source PCB 12c and the timing controller board P2. For example, the second cables 12BP, 12CP, 12DP, and 12EP may be Flexible Flat Cables (FFC). Meanwhile, the timing controller board P2 may be integrated into the main board P2, in which case the second cables 12BP, 12CP, 12DP, and 12EP may be electrically connected to the main board P3.

Accordingly, the timing controller board P2 or the main board P3 may provide digital video data and timing control signals to the display panel 10 through the source PCBs 12a, 12b, 12c, and 12d.

The back cover 70 may be disposed at the rear of the frame 60 and may be coupled to the frame 60. The board P may be disposed between the frame 60 and the back cover 70 and may be covered by the back cover 70.

Referring to FIGS. 7 and 8, the frame 60 may include a flat plate part 60F, an inclined part 60M, a support part 60N, and an insertion part 60E.

The flat plate part 6OF may have a generally flat shape and may occupy most of the frame 60. A pressed part 60 P may be formed by being pressed from a front surface of the flat plate part 60F toward the rear and may improve the rigidity of the frame 60. For example, a PEM nut (not numbered) may be formed on the pressed part 60P, and the board P (see FIG. 6) may be screw-coupled to the PEM nut.

The inclined part 60M may extend obliquely from a periphery of the flat plate part 60F. An angle between the inclined part 60M and the flat plate part 60F may be an obtuse angle. The support part 60N may be bent from a periphery of the inclined part 60M and may be substantially parallel to the flat plate part 60F. In other words, the support part 60N may be offset in front of the flat plate part 60F, and the inclined part 60M may connect the flat plate part 60F and the support part 60N.

The insertion part 60E may be bent rearward from a periphery of the support part 60N. The insertion part 60E may define edges of the frame 60. That is, the insertion part 60E may define an upper side 60U, a lower side 60D, a left side 60Le and a right side 60Ri. A plurality of protrusions 60k may be formed on an outer surface of a portion of the insertion part 60E that defines the lower side 60D and may be spaced apart from each other along the lower side 60D.

A seating part 60S may be disposed adjacent to the lower side 60D of the frame 60. The seating part 60S may be disposed between a boundary, which is between the flat plate part 60F and the inclined part 60M, and a portion of the insertion part 60E that defines the lower side 60D. The seating part 60S may be formed on the inclined part 60M or the support part 60N, or may be formed on the inclined part 60M and the support part 60N. The seating part 60S may be formed as one body with the frame 60. The seating part 60S may be formed by being pressed from a front surface of at least one of the inclined part 60M and the support part 60N toward the rear. As the seating part 60S has the shape (i.e., a pressed shape) and arrangement (i.e., arranged in a bent area of the frame), the rigidity of the seating part 60S may be improved, and deformation of the seating part 60S may be minimized during a process of coupling or separating the seating part 60S to and from a holder 100 (see FIG. 10) which will be described later.

In addition, a height of the seating part 60S from the support part 60N may be smaller than a height of the flat plate part 60F from the support part 60N. In other words, a rear surface of the seating part 60S may be disposed in front of a rear surface of the flat plate part 60F. In this case, it is possible to minimize excessive protrusion of the holder 100 (see FIG. 10), which is coupled to the seating part 60S and which will be described later, rearwardly from the frame 60. The rear surface of the seating part 60S may be formed flat. A slot 60H may be formed through the rear surface of the seating part 60S. For example, the slot 60H may be a square-shaped hole. The seating part 60S may be referred to as a mount 60S. The slot 60H may be referred to as a frame hole 60H or a piercing hole 60H.

For example, a plurality of seating parts 60S1, 60S2, 60S3, 60S4, 60S5, 60S6, 60S7, 60S8, 60S9, 60S10, 60S11, and 60S12 may be spaced apart from each other along the lower side 60D. Each of the plurality of seating parts 60S1, 60S2, 60S3, 60S4, 60S5, 60S6, 60S7, 60S8, 60S9, 60S10, 60S11, and 60S12 may have the slot 60H. A first seating part 60S1 may be adjacent to the left side 60Le of the frame 60, a twelfth seating part 60S12 may be adjacent to the right side 60Ri of the frame 60, and second to eleventh seating parts 60S2, 60S3, 60S4, 60S5, 60S6, 60S7, 60S8, 60S9, 60S10, and 60S11 may be disposed between the first seating part 60S1 and the twelfth seating part 60S12.

In another example, instead of the plurality of seating parts 60S1, 60S2, 60S3, 60S4, 60S5, 60S6, 60S7, 60S8, 60S9, 60S10, 60S11, and 60S12 described above, the seating part 60S may be elongated from left to right by a distance corresponding to a region in which the seating parts are disposed. In this case, a plurality of slots 60H may be formed in the seating part 60S and may be spaced apart from each other in a longitudinal direction of the seating part 60S.

A rib 60R may be adjacent to the boundary between the flat plate part 60F and the inclined part 60M, and may protrude rearward from the rear surface of the flat plate part 60F. The rib 60R may be formed as one body with the frame 60. The rib 60R may be vertically aligned with the slot 60H. Alternatively, the rib 60R may be vertically misaligned with the slot 60H. The rib 60R may include a connecting part 60Ra and a bending part 60Rb. The connecting part 60Ra may intersect or may be perpendicular to the flat plate part 60F. The connecting part 60Ra may be referred to as a vertical part 60Ra. The bending part 60Rb may be bent downward from a rear end of the connecting part 60Ra. The bending part 60Rb may be referred to as a horizontal part 60Rb. A gap between the flat plate part 60F and the bending part 60Rb may correspond to a width from front to rear of the connecting part 60Ra. The rib 60R may be referred to as a fixing rib 60R or a hook 60R.

For example, a plurality of ribs 60R may be spaced apart from each other along the boundary between the flat plate part 60F and the inclined part 60M. The respective ribs 60R may be vertically aligned with the respective slots 60H. Alternatively, in a horizontal direction, the plurality of ribs 60R may be arranged alternately with the plurality of slots 60H. Meanwhile, ribs corresponding to the slots 60H of the first seating part 60S1 and the twelfth seating part 60S12 may be omitted.

In another example, the ribs 60R may be elongated from left to right corresponding a region in which the plurality of seating parts 60S1, 60S2, 60S3, 60S4, 60S5, 60S6, 60S7, 60S8, 60S9, 60S10, 60S11, and 60S12 are disposed or corresponding to the seating part 60S which is elongated from left to right. In this case, some of the ribs 60R may be vertically aligned with the plurality of slots 60H.

Referring to FIGS. 7 and 9, the guide panel 13 may extend along the edge of the frame 60, i.e., the insertion part 60E. The guide panel 13 may cover the upper side 60U, the lower side 60D, the left side Le, and the right side Ri of the frame 60 (see FIG. 8).

A bottom part 130 may define a lower side 13D of the guide panel 13, and may be disposed under the lower side 60D of the frame 60. A hole 13H may be formed by vertically penetrating the bottom part 130 and may be aligned with the protrusions 60k. Each of the plurality of protrusions 60k may be caught by each of the plurality of holes 13H. Accordingly, the guide panel 13 may be detachably coupled to the frame 60.

Meanwhile, each of coupling points of the protrusions 60k and the holes 13H may be adjacent to each of the plurality of seating parts 60S. Accordingly, it is possible to minimize movement or torsion of the seating part 60S corresponding to an action of removing the holder 100 from the slot 60H.

Referring to FIG. 10, the holder 100 may be disposed at the rear of the frame 60 and may be aligned with the slot 60H of the seating part 60S. Each of the plurality of holders 100 may be detachably inserted into each of the plurality of slots 60H.

Referring to FIGS. 11 to 13, the holder 100 may include a body 101, a neck 102, and a head 103. The holder 100 may have elasticity. For example, the holder 100 may include a silicone or rubber material.

The body 101 may have a generally block shape. The body 101 may form a central portion of the holder 100.

The neck 102 may be connected to a front end of the body 101, and may have a width Wb smaller than a width Wa of the body 101. The width Wa of the body 101 and the width Wb of the neck 102 are defined in the left-right direction. A left surface 102a of the neck 102 may be formed by recessing the left surface of the body 101 toward the right side, and a right surface 102b of the neck 102 may be formed by recessing the right surface of the body 101 toward the left side. For example, a step (see ha of FIG. 12) between the left surface 102a of the neck 102 and the left surface of the body 101 may be substantially equal to a step between the right surface 102b of the neck 102 and the right surface of the body 101.

The head 103 may be connected to a front end of the neck 102 and may have a width Wc, greater than the width Wb of the neck 102, and a height equal to the height of the neck 102. The width Wc of the head 103 is defined in the left-right direction, and the height of the head 103 is defined in the up-down direction. A First ear 103a of the head 103 may protrude leftward from a front side of the left surface 102a of the neck 102, and a second ear 103b of the head 103 may protrude rightward from a front side of the right surface 102b of the neck 102. For example, the width Wc of the head 103 may be greater than the width Wa of the body 101. In another example, the width Wc of the head 103 may be equal to the width Wa of the body 101 and may fall between the width Wa of the body 101 and the width Wb of the neck 102.

Accordingly, the first ear 103a and the second ear 103b of the head 103 may be bent forward or rearward by an external force, and when the external force is released, the first ear 103a and the second ear 103b may be unfolded side by side in the left-right direction.

In addition, the holder 100 may include a back 106 and a flap 107. The back 106 may protrude rearward from a rear surface of the body 101. The back 106 may be opposite the neck 102 with respect to the body 101. The position and height of the back 106 may correspond to the position and height of the neck 102. The flap 107 may protrude upward from an upper end of the back 106 and may extend along the body 101 or the back 106. An upper end of the flap 107 may be spaced downward from an upper end of the body 101. A groove 100P may be formed between the body 101 and the flap 107 and may extend along the flap 107.

Accordingly, the flap 107 may be bent forward or rearward by an external force, and when the external force is released, the flap 107 may be unfolded side by side in the up-down direction. Meanwhile, a bump 105 may be disposed above the groove 100P, may protrude rearward from a rear surface of the body 101, and may extend in the left-right direction. A plurality of bumps 105 may be vertically spaced apart from each other, and at least one notch 105a may be disposed between the plurality of bumps 105.

In addition, the holder 100 may include a leg 108. The leg 108 may protrude downward from a lower surface of the body 101. A portion of the leg 108 may be bent forward and the leg 108 may have a generally foot shape. A first recess 108a may be formed in a left surface of the leg 108, and a second recess 108b may be formed in a right surface of the leg 108. A third recess 109 may be formed in a lower surface of the leg 108.

An upper inclined surface 104 may define a front surface of the upper part of the body 101 and may be inclined by a first angle theta a with respect to a straight line parallel to the front-rear direction. A lower inclined surface 110 may define an upper surface of a lower part of the leg 108 and may be inclined by a second angle theta b with respect to a straight line parallel to the front-rear direction. For example, the first angle theta a may be greater than the second angle theta b and may be an acute angle.

Referring to FIGS. 13 and 14, a width of the neck 102 of the holder 100 may correspond to a width of the slot 60H of the seating part 60S. That is, a longitudinal section of the neck 102 may have a shape and size corresponding to the shape and size of the slot 60H (see Sh of FIG. 7). The size of the longitudinal section of the neck 102 may be substantially equal or similar to the size of the slot 60H. In the left-right direction, the width of the head 103 of the holder 100 may be greater than the width of the slot 60H.

In response to a user's action of inserting the holder 100 into the seating part 60S, the ears 103a and 103b (see FIG. 12) of the head 103 may be tilted back to pass through the slot 60H, and the ears 103a and 103 having passed through the slot 60H may be unfolded again to be caught by an inner surface of the seating part 60S. By contrast, in response to a user's action of removing the holder 100 from the seating part 60S, the ears 103a and 103b (see FIG. 12) of the head 103 may be tilted forward to pass through the slot 60H, and the ears 103a and 103b having passed through the slot 60H may be unfolded again.

Accordingly, each of the plurality of holders 100 may be detachably coupled to each of the plurality of seating parts 60S.

Referring to FIG. 15, the flap 107 of the holder 100 mounted to the frame 60 may be vertically aligned with the bending part 60Rb of the rib 60R. Alternatively, the flap 107 of the holder 100 may be vertically misaligned with the bending part 60Rb of the rib 60R. A space between the flat plate part 60F and the bending part 60Rb may vertically face or may be vertically misaligned with the groove 100P (see FIG. 13).

A source PCB 12 may have a plate shape that is elongated in the left-right direction. The source PCB 12 may be referred to as an S-PCB 12. For example, the source PCB 12 may include a plurality of source PCBs 12a, 12b, 12c, and 12d (see FIG. 6) which are spaced apart from each other in the left-right direction. The source PCB 12 may be disposed at the rear of the frame 60, and may be inserted between the rib 60R and the holder 100. To this end, a user may diagonally insert an upper side 12U of the source PCB 12 into the space between the flat plate part 60F and the bending part 60Rb, and then may move a lower side 12D of the source PCB 12 toward the flap 107. Further, when the user pushes the source PCB 12, placed on a rear surface of the flap 107, toward the front, the flap 107 may be bent forward, and the lower side 12D of the source PCB 12 may move toward the front of the flap 107 along the bent flap 107. In addition, when the lower side 12D of the source PCB 12 is placed on the front side of the flap 107, the flap 107 may be unfolded again.

In this case, the upper side 12U of the source PCB 12 may be disposed in the space between the flat plate part 60F and the bending part 60Rb, and may be adjacent to or in contact with a lower surface of the connecting part 60Ra. The lower side 12D of the source PCB 12 may be disposed in a space between the body 101 and the flap 107, and may be adjacent to or in contact with the groove 100P (see FIG. 13).

Accordingly, the source PCB 12 may be clamped between the rib 60R and the holder 100. The rear surface of the frame 60 may limit forward movement of the source PCB 12, and the bending part 60Rb and the flap 107 may limit rearward movement of the source PCB 12.

The rib 60R and the holder 100 which are vertically aligned with each other may be collectively referred to as a clamp 60R, 100 or a grap 60R, 100. A plurality of clamps 60R, 100 may be spaced apart from each other in a longitudinal direction of the source PCB 12 and may stably clamp the source PCB 12.

Meanwhile, the first cable 11 may be disposed below the lower side 13D of the guide panel 13. A front end of the first cable 11 may be disposed at the front of the guide panel 13 and may be electrically connected to the display panel 10 (see FIG. 6). A rear end of the first cable 11 may be disposed at the rear of the guide panel 13 and may be electrically connected to the source PCB 12. For example, a plurality of first cables 11 may be electrically connected to the source display panel 10 and the source PCB 12. For example, the plurality of first cables 11 may be disposed between the plurality of holders 100.

Referring to FIGS. 16 to 18, in the vertical direction, a width (height) of the source PCB 12 may correspond to a distance between the connecting part 60Ra of the rib 60R and the groove 100P of the holder 100.

Referring to FIG. 16, in the vertical direction, a width H12 of the source PCB 12 may be equal to or smaller than a distance H10a between the connecting part 60Ra and the groove 100P. In the vertical direction, the width H12 may be greater than the distance H10b between the bending part 60Rb and the flap 107. In this case, in the vertical direction, a position of the slot 60H, into which the neck 102 (see FIG. 12) of the holder 100 is inserted, may be a first position TP1.

Referring to FIG. 17, in the vertical direction, a width H12' of the source PCB 12 may be equal to or smaller than a distance H10a' between the connecting part 60Ra and the groove 100P. In the vertical direction, the width H12' may be greater than a distance H10b' between the bending part 60Rb and the flap 107. The width H12' may be greater than the width H12 (see FIG. 16), and the distance H10b' may be greater than the distance H10b (see FIG. 16). In this case, in the vertical direction, a position of the slot 60H, into which the neck 102 (see FIG. 12) of the holder 100 is inserted, may be a second position TP2 which is lower than the first position TP1 (see FIG. 16). In other words, if the width (height) of the source PCB 12 is relatively large, the slot 60H may be formed at a relatively lower position in a rear surface 60Sr of the seating part 60S. That is, a difference between the width H12' and the width H12, or a difference between the distance H10a' and the distance H10a may correspond to a vertical distance between the center of the first position TP1 and the center of the second position TP2.

Referring to FIG. 18, in the vertical direction, a width H12" of the source PCB 12 may be equal to or smaller than a distance H10a" between the connecting part 60Ra and the groove 100P. In the vertical direction, the width H12" may be greater than a distance H10b" between the bending part 60Rb and the flap 107. The width H12" may be smaller than the width H12 (see FIG. 16), and the distance H10b" may be smaller than the distance H10b (see FIG. 16). In this case, in the vertical direction, a position of the slot 60H, into which the neck 102 (see FIG. 12) of the holder 100 is inserted, may be a third position TP3 which is higher than the first position TP1 (see FIG. 16). In other words, if the width (height) of the source PCB 12 is relatively small, the slot 60H may be formed at a relatively higher position in the rear surface 60Sr of the seating part 60S. That is, a difference between the width H12 and the width H12", or a difference between the distance H10a and the distance H10a" may correspond to a vertical distance between the center of the third position TP3 and the center of the first position TP1.

Accordingly, the slot 60H and the holder 100 which is coupled thereto may be adjusted in position according to the width (height) of the source PCB 12. In other words, by simply changing the position of the slot 60H, it is possible to easily fit various widths (heights) of the source PCBs 12.

The structure for adjusting the position of the holder 100 described above may also be applied according to changes in length of the first cable 11 (see FIG. 15). For example, if a length of the first cable 11 is relatively short, a user may move the position of the slot 60H to a lower position to move the position of the source PCB 12, engaged with the holder 100, to a lower position for connection to the first cable 11. For example, if a length of the first cable 11 is relatively long, in order to prevent the first cable 11 from hanging down or folding, a user may move the position of the slot 60H to a higher position to move the position of the source PCB 12, engaged with the holder 100, to a higher position.

Referring to FIG. 19, a shield plate 120 may be disposed at the rear of the plurality of source PCBs 12 and may be detachably coupled to the frame 60. The shield plate 120 may cover the rear of the plurality of source PCBs 12.

Referring to FIG. 20, the upper inclined surface 104 may have a shape corresponding to the inclined part 60M. The upper inclined surface 104 may be adjacent to or in contact with the inclined part 60M. The lower inclined surface 110 may have a shape corresponding to a lower surface of the seating part 60S. The lower inclined surface 110 may be adjacent to (see G11) or in contact with the lower surface of the seating part 60S.

The lower side of the source PCB 12 may be disposed on the groove 100P. The upper side of the source PCB 12 may contact the lower surface of the connecting part 60Ra. Alternatively, in the vertical direction, the width (see H12") of the source PCB 12 may be smaller than the distance (see H10a") between the connecting part 60Ra and the groove 100P. Accordingly, the source PCB 12 may be smoothly inserted or removed between the connecting part 60Ra and the groove 100P.

A rear surface of the source PCB 12 may contact the bending part 60Rb and the flap 107. Alternatively, the rear surface of the source PCB 12 may be spaced forward from the bending part 60Rb and the flap 107. Accordingly, the source PCB 12 may be smoothly inserted or removed between the connecting part 60Ra and the groove 100P and may minimize damage to the source PCB 12 caused by the bending part 60Rb and the flap 107.

A cover part 120P of the shield plate 120 may be opposite the source PCB 12 with respect to the bending part 60Rb and the flap 107 and may be spaced a certain gap G10 rearwardly from the source PCB 12. A lower portion 120R of the shield plate 120 may extend downward from the cover part 120P and may be supported by the rear surface of the back 106 of the holder 100. An upper portion of the shield plate 120 may extend upward from the cover part 120P and may be screw-coupled to a support part 60SP (see FIG. 19) protruding rearward from the rear surface of the frame 60.

Accordingly, even when an external force, directed toward the source PCB 12, is applied to the rear surface of the cover part 120P, the gap G10 between the cover part 120P and the source PCB 12 may be maintained as much as possible.

Meanwhile, a substrate 32, which is plate-shaped, may be mounted on a front surface of the flat plate part 60F of the frame 60. The reflective sheet 36 may include a first part 361 covering a front surface of the substrate 32, a second part 362 extending obliquely from a periphery of the first part 361, and a third part 363 bent from a periphery of the second part 362. The hole 36a, in which the light source is disposed, may be formed in the first part 361, and the third part 363 may be sandwiched between the support part 60N and the diffusion plate 39.

Meanwhile, light from the light source may be provided to the display panel 10 through the diffusion plate 39 and the optical sheet 40. A rear pad 13AE may be disposed between a front part 13F of the guide panel 13 and the optical sheet 40 and may be coupled or attached to the front part 13F and the optical sheet 40. A front pad 13AD may be disposed between the display panel 10 and the front part 13F and may be coupled or attached to the display panel 10 and the front part 13F. Accordingly, the display panel 10 may be coupled to the frame 560 through the guide panel 13.

Meanwhile, the case top 15 may cover a side surface of the guide panel 13 and may be coupled to the guide panel 13.

Referring to FIGS. 1 to 20, a display device according to an aspect of the present disclosure may includes: a display panel; a frame which is disposed at a rear of the display panel, and to which the display panel is coupled; a substrate mounted on one surface of the frame; a rib protruding from the frame and holding one side of the substrate; and a holder opposite to the rib with respect to the substrate and holding the other side of the substrate, wherein the holder may be detachably coupled to the frame.

The display device may further include a board mounted on the one surface of the frame, wherein the substrate may be a source PCB electrically connected to the display panel and the board.

The frame may include a slot which is formed through the frame, and into which the holder is detachably coupled.

A width of the source PCB may be a distance between the one side and the other side of the source PCB, and a position of the slot may be variable corresponding to the width of the source PCB.

The holder may include: a body; a neck connected to the body and having a width smaller than a width of the body; and a head opposite to the body with respect to the neck and having a width greater than the width of the neck, wherein a width of the slot may be substantially equal to the width of the neck.

The head may include: a first ear extending in a first direction from one side of the neck; and a second ear extending in a second direction, opposite to the first direction, from the other side of the neck, wherein the width of the head may be defined between the first ear and the second ear, and the first ear and the second ear may have elasticity and are caught by a boundary of the slot.

The frame may include: a flat plate part; an inclined part extending obliquely from a periphery of the flat plate part; and a seating part formed on the inclined part and having the slot, wherein the rib may be adjacent to a boundary between the flat plate part and the inclined part and may be formed at the flat plate part.

One surface of the seating part, at which the slot is formed, may be positioned lower than the flat plate part.

The display device may further include a guide frame extending along a periphery of the frame, wherein the frame may further include a protrusion protruding from one side of the frame toward the guide frame, wherein the guide frame may include a hole into which the protrusion is inserted and caught, and the protrusion and the hole may be adjacent to the seating part.

A width of the source PCB may be a distance between the one side and the other side of the source PCB, wherein a portion of the rib and a portion of the holder may be opposite to the frame with respect to the source PCB, and may be spaced apart from each other by a distance smaller than the width of the source PCB.

The one side of the source PCB may be disposed in a space between the frame and the portion of the rib, wherein the holder may include a groove in which the second side of the source PCB is disposed.

The portion of the holder may have elasticity.

The rib may include: a connecting part protruding from the frame and covering the one side of the source PCB; and a bending part bent from a distal end of the connecting part toward the holder, wherein the holder may include: a body; a back protruding from the body and covering the other side of the source PCB; and a flap bent from the back toward the bending part, wherein a distance between the bending part and the flap may be smaller than the width of the source PCB, and the flap may have elasticity.

The groove may be formed between the body and the flap, wherein the width of the source PCB may be smaller than a distance between the connecting part and the groove, wherein a thickness of the source PCB may be smaller than a gap between the frame and the bending part and a gap between the body and the flap.

The source PCB may be disposed on a rear surface of the frame, and may be adjacent to one side of the frame to extend along the one side, wherein the rib may include a plurality of ribs which are spaced apart from each other in a longitudinal direction of the source PCB, wherein the holder may include a plurality of holders corresponding to the plurality of ribs.

The display device may further include first cables adjacent to one side of the frame and electrically connecting the display panel and the source PCB; and second cables electrically connecting the source PCB and the board, wherein the source PCB may include a plurality of source PCBs which are spaced apart from each other along the one side of the frame.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

The invention claimed is:
1. A display device comprising:
a display panel;
a frame which is disposed at a rear of the display panel, and to which the display panel is coupled;
a board mounted on one surface of the frame;
a source PCB disposed on the one surface of the frame and electrically connected to the display panel and the board;

a rib protruding from the frame and by which one side of the source PCB is caught; and a holder opposite to the rib with respect to the source PCB and by which the other side of the source PCB is caught, wherein the holder is detachably coupled to the frame.

2. The display device of claim 1, wherein the frame comprises a slot which is formed through the frame, and into which the holder is detachably coupled.

3. The display device of claim 2, wherein a width of the source PCB is a distance between the one side and the other side of the source PCB, and a position of the slot is variable corresponding to the width of the source PCB.

4. The display device of claim 2, wherein the holder comprises:

a body;

a neck connected to the body and having a width smaller than a width of the body; and a head opposite to the body with respect to the neck and having a width greater than the width of the neck, wherein a width of the slot is substantially equal to the width of the neck.

5. The display device of claim 4, wherein the head comprises:

a first ear extending in a first direction from one side of the neck; and a second ear extending in a second direction, opposite to the first direction, from the other side of the neck, wherein the width of the head is defined between the first ear and the second ear, and the first ear and the second ear have elasticity and are caught by a boundary of the slot.

6. The display device of claim 2, wherein the frame comprises:

a flat plate part;

an inclined part extending obliquely from a periphery of the flat plate part; and a seating part formed on the inclined part and having the slot, wherein the rib is adjacent to a boundary between the flat plate part and the inclined part and is formed at the flat plate part.

7. The display device of claim 6, wherein one surface of the seating part, at which the slot is formed, is positioned lower than the flat plate part.

8. The display device of claim 7, further comprising a guide frame extending along a periphery of the frame, wherein the frame further comprises a protrusion protruding from one side of the frame toward the guide frame, wherein the guide frame comprises a hole into which the protrusion is inserted and caught, and the protrusion and the hole are adjacent to the seating part.

9. The display device of claim 1, wherein a width of the source PCB is a distance between the one side and the other side of the source PCB, wherein a portion of the rib and a portion of the holder are opposite to the frame with respect to the source PCB, and are spaced apart from each other by a distance smaller than the width of the source PCB.

10. The display device of claim 9, wherein the one side of the source PCB is disposed in a space between the frame and the portion of the rib, wherein the holder comprises a groove in which the second side of the source PCB is disposed.

11. The display device of claim 10, wherein the portion of the holder has elasticity.

12. The display device of claim 11, wherein the rib comprises:

a connecting part protruding from the frame and covering the one side of the source PCB; and a bending part bent from a distal end of the connecting part toward the holder, wherein the holder comprises:

a body;

a back protruding from the body and covering the other side of the source PCB; and a flap bent from the back toward the bending part, wherein a distance between the bending part and the flap is smaller than the width of the source PCB, and the flap has elasticity.

13. The display device of claim 12, wherein the groove is formed between the body and the flap, wherein the width of the source PCB is smaller than a distance between the connecting part and the groove, wherein a thickness of the source PCB is smaller than a gap between the frame and the bending part and a gap between the body and the flap.

14. The display device of claim 13, wherein the source PCB is disposed on a rear surface of the frame, and is adjacent to one side of the frame to extend along the one side, wherein the rib comprises a plurality of ribs which are spaced apart from each other in a longitudinal direction of the source PCB, wherein the holder comprises a plurality of holders corresponding to the plurality of ribs.

15. The display device of claim 1, further comprising:

first cables adjacent to one side of the frame and electrically connecting the display panel and the source PCB; and second cables electrically connecting the source PCB and the board, wherein the source PCB comprises a plurality of source PCBs which are spaced apart from each other along the one side of the frame.

* * * * *